(12) United States Patent
Nishio et al.

(10) Patent No.: US 8,347,057 B2
(45) Date of Patent: Jan. 1, 2013

(54) MEMORY MODULE

(75) Inventors: Yoji Nishio, Tokyo (JP); Takao Ono, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 328 days.

(21) Appl. No.: 12/805,689

(22) Filed: Aug. 13, 2010

(65) Prior Publication Data

US 2011/0055616 A1 Mar. 3, 2011

(30) Foreign Application Priority Data

Aug. 27, 2009 (JP) ................................. 2009-197267

(51) Int. Cl.
*G06F 12/00* (2006.01)

(52) U.S. Cl. ....................................................... 711/167

(58) Field of Classification Search ......................... None
See application file for complete search history.

(56) References Cited

U.S. PATENT DOCUMENTS

| 7,321,524 | B2 * | 1/2008 | Shaeffer et al. | ............ 365/233.1 |
| 7,440,289 | B2 | 10/2008 | Sugano et al. | |
| 7,671,853 | B2 * | 3/2010 | Morita | ............................. 345/211 |
| 2004/0160256 | A1 * | 8/2004 | Kuroda et al. | ................. 327/277 |
| 2008/0123303 | A1 | 5/2008 | Sugano et al. | |
| 2008/0256282 | A1 | 10/2008 | Guo et al. | |
| 2010/0014264 | A1 * | 1/2010 | Lim | ................................. 361/783 |
| 2010/0287335 | A1 * | 11/2010 | Chung et al. | ................... 711/103 |

FOREIGN PATENT DOCUMENTS

JP 2008-135597 A 6/2008

OTHER PUBLICATIONS

Korean Office Action dated Feb. 8, 2012, with partial Japanese and English translation.

* cited by examiner

*Primary Examiner* — Hiep Nguyen

(74) *Attorney, Agent, or Firm* — McGinn IP Law Group, PLLC

(57) ABSTRACT

A memory buffer mounted on a memory module includes a pre-launch function of advancing outputs of address/command signal and a post-launch function of delaying outputs of control signal. A time step increment for pre/post-launch time adjustment is set to be equal to or finer than tCK/32 where tCK is one clock cycle.

15 Claims, 23 Drawing Sheets

FIG. 6

| | CONFIGU-RATION | PKG TYPE | DRAM ARRANGE-MENT | QCA TRACE LOAD | CTRL SIGNALS QCS TRACE LOAD | QODT TRACE LOAD | QCKE TRACE LOAD | Y (CLK) TRACE LOAD |
|---|---|---|---|---|---|---|---|---|
| LP (LOW PROFILE) | 2Rx8 | Mono | 1Row | 2 | 1 | 1 | 1 | 2 |
| | 2Rx4 | Mono | 2Row | 2 | 1 | 1 | 1 | 2 |
| | 4Rx8 | DDP | 1Row | 2-4 | 1-2 | 1-2 | 1-2 | 2 |
| | 4Rx8 | Mono | 2Row | 2 | 1 | 1 | 1 | 2 |
| | 4Rx4 | DDP | 1Row | 2-4 | 1 | 1 | 1-2 | 2 |
| | 4Rx4 | DDP | 2Row | 4 | 1 | 1 | 1-2 | 4-2 |
| | 8Rx8 | DDP | 2Row | 4 | 1 | 1 | 1-2 | 4-2 |
| | 8Rx4 | QDP | 2Row | 8-4 | 1 | 1 | 2 | 4-8 |
| VLP (VERY LOW PROFILE) | 2Rx8 | Mono | 1Row | 2 | 1 | 1 | 1 | 2 |
| | 2Rx4 | DDP | 1Row | 2-4 | 1-2 | 1-2 | 1-2 | 2 |
| | 4Rx8 | DDP | 1Row | 2-4 | 1-2 | 1-2 | 1-2 | 2 |
| | 4Rx4 | QDP | 1Row | 4 | 1 | 1 | 2 | 4 |
| | 8Rx8 | QDP | 1Row | 4 | 1 | 1 | 2 | 4 |

SINCE NUMBER OF LAYOUT METHODS IS NOT ONE, EXPRESSION SUCH AS 8-4 (8 OR 4) IS USED.

FIG. 7

- QACA (CA SIGNAL FOR LEFT SIDE ): A0, A1 OR THE LIKE
- QBCA (CA SIGNAL FOR RIGHT SIDE ): A0, A1 OR THE LIKE
- QACS[3:0]# (CS SIGNAL FOR LEFT SIDE ): 4 PINS
- QBCS[3:0]# (CS SIGNAL FOR RIGHT SIDE ): 4 PINS
- QAODT[1:0] (ODT SIGNAL FOR LEFT SIDE ): 2 PINS
- QBODT[1:0] (ODT SIGNAL FOR RIGHT SIDE ): 2 PINS
- QACKE[3:0] (CKE SIGNAL FOR LEFT SIDE ): 4 PINS
- QBCKE[3:0] (CKE SIGNAL FOR RIGHT SIDE ): 4 PINS
- Y[3:0]/Y[3:0]# (CLK SIGNALS ): 4 PAIRS

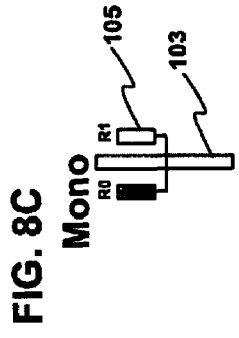
FIG. 8C
Mono
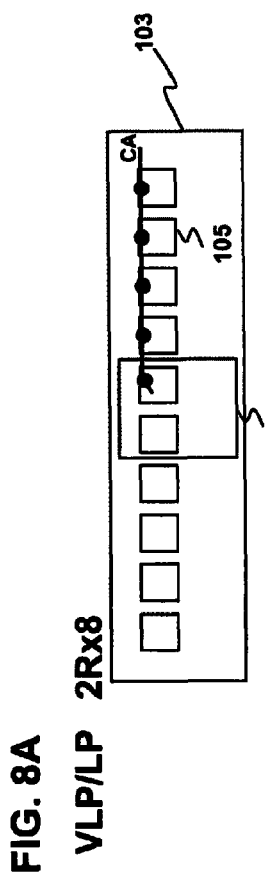
FIG. 8A
VLP/LP 2Rx8
FIG. 8B
FIG. 8D
ONE EXAMPLE OF RANK
ALLOTMENT (SAME AS BELOW)
CA trace load    2
CS trace load    1
ODT              1
CKE              1
Y trace load     2
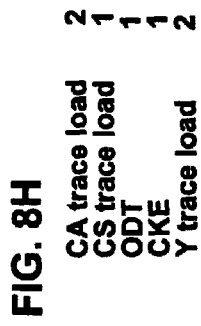
FIG. 8G
Mono
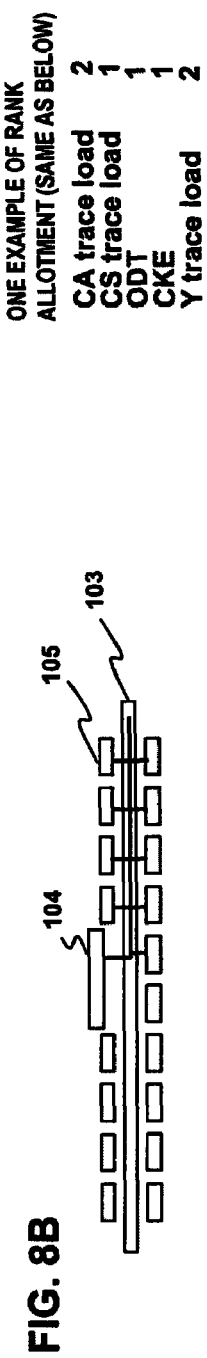
FIG. 8E
LP 2Rx4
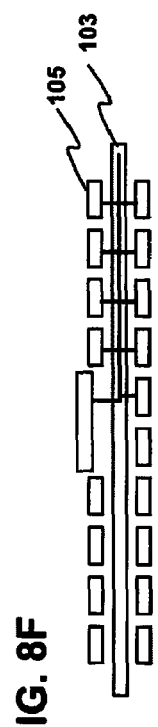
FIG. 8F
FIG. 8H
CA trace load    2
CS trace load    1
ODT              1
CKE              1
Y trace load     2

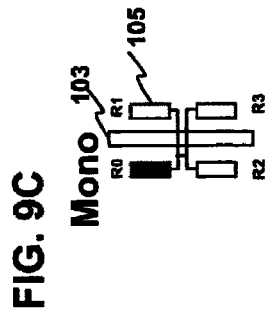
FIG. 9C
Mono
FIG. 9D
CA trace load 2
CS trace load 1
ODT 1
CKE 1-2
Y trace load 2
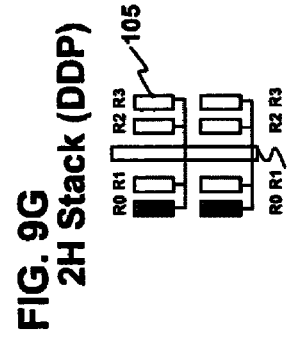
FIG. 9G
2H Stack (DDP)
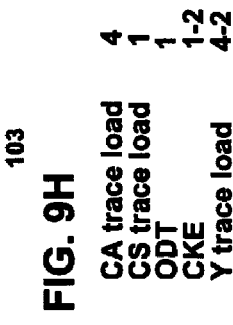
FIG. 9H
CA trace load 4
CS trace load 1
ODT 1
CKE 1-2
Y trace load 4-2
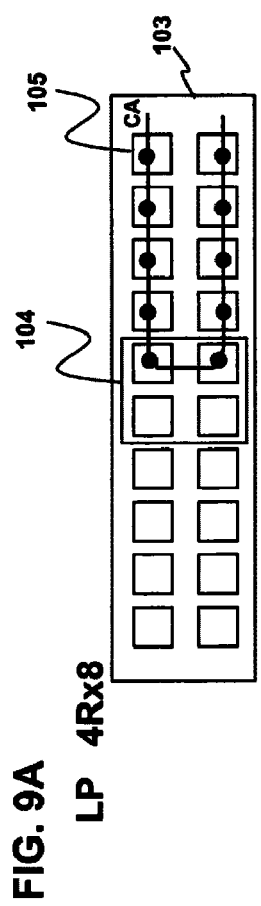
FIG. 9A
LP 4Rx8
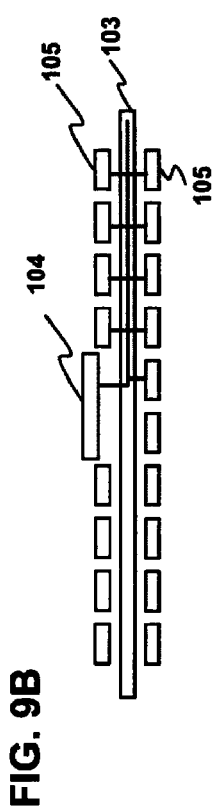
FIG. 9B
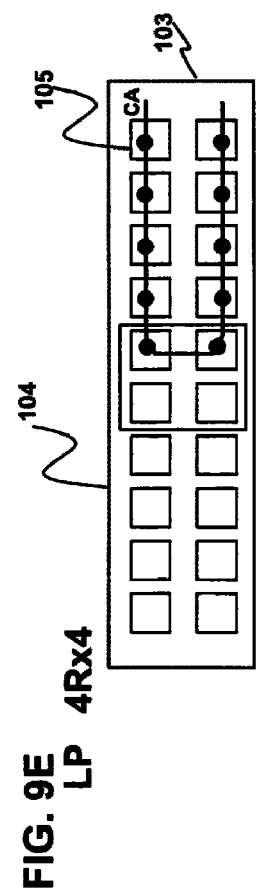
FIG. 9E
LP 4Rx4
FIG. 9F

2H

| | |
|---|---|
| CA trace load | 4 |
| CS trace load | 1 |
| ODT | 1 |
| CKE | 1-2 |
| Y trace load | 4-2 |

4H Stack (QDP)

4 of Rtt (Right pin)

| | |
|---|---|
| CA trace load | 8-4 |
| CS trace load | 1 |
| ODT | 1 |
| CKE | 2 |
| Y trace load | 8-4 |

LP 8Rx8

LP 8Rx4

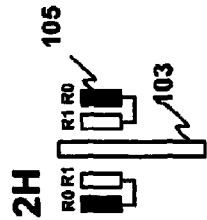
FIG. 11C
2H
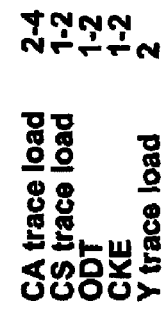
FIG. 11D
| | |
|---|---|
| CA trace load | 2-4 |
| CS trace load | 1-2 |
| ODT | 1-2 |
| CKE | 1-2 |
| Y trace load | 2 |
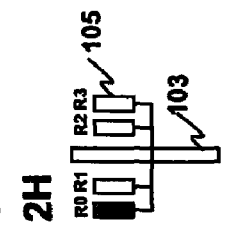
FIG. 11G
2H
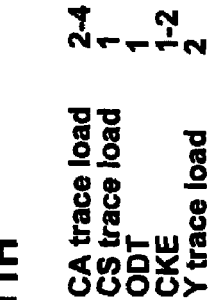
FIG. 11H
| | |
|---|---|
| CA trace load | 2-4 |
| CS trace load | 1 |
| ODT | 1 |
| CKE | 1-2 |
| Y trace load | 2 |
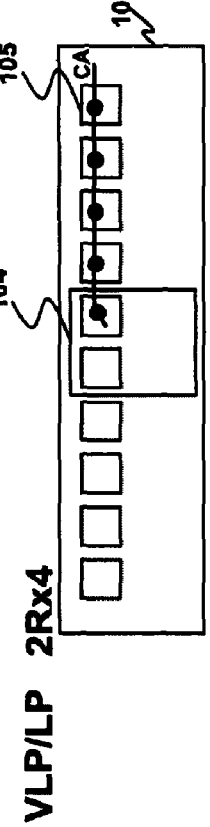
FIG. 11A
VLP/LP 2Rx4
FIG. 11B
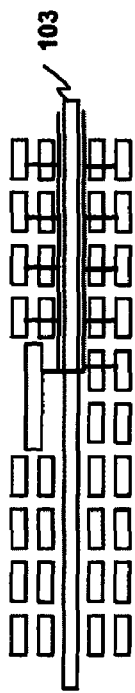
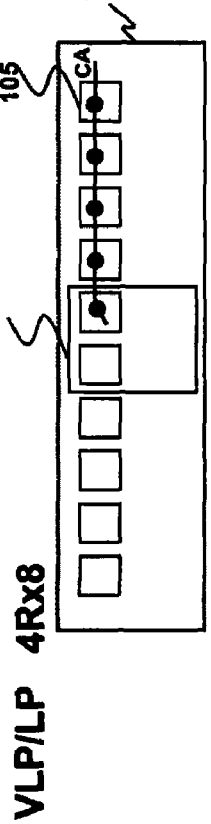
FIG. 11E
VLP/LP 4Rx8
FIG. 11F
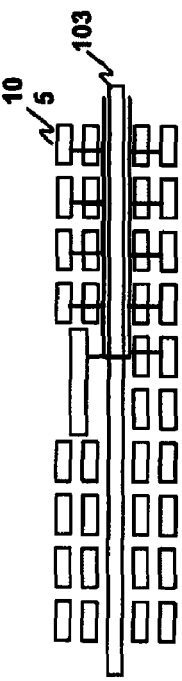

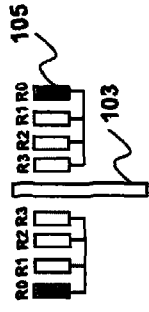
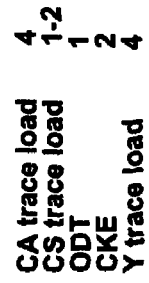
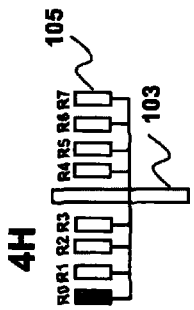
FIG. 12C
4H
FIG. 12D
FIG. 12G
4H
FIG. 12H
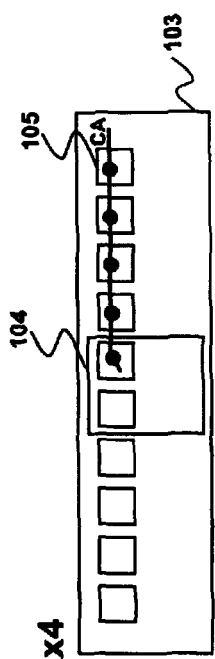
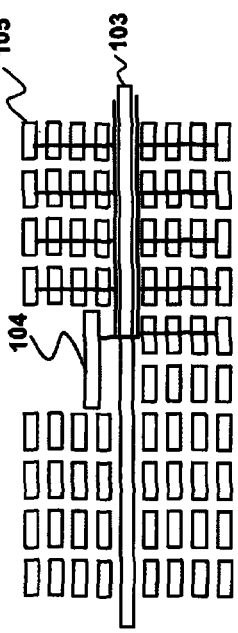
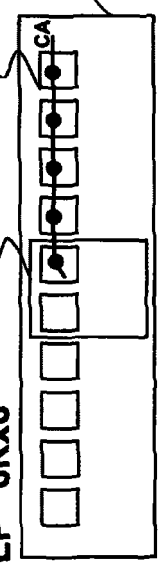
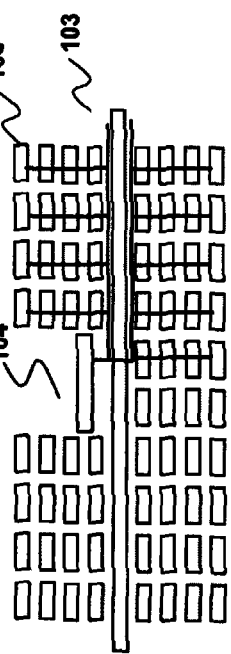
FIG. 12A VLP 4R×4
FIG. 12B
FIG. 12E VLP 8R×8
FIG. 12F

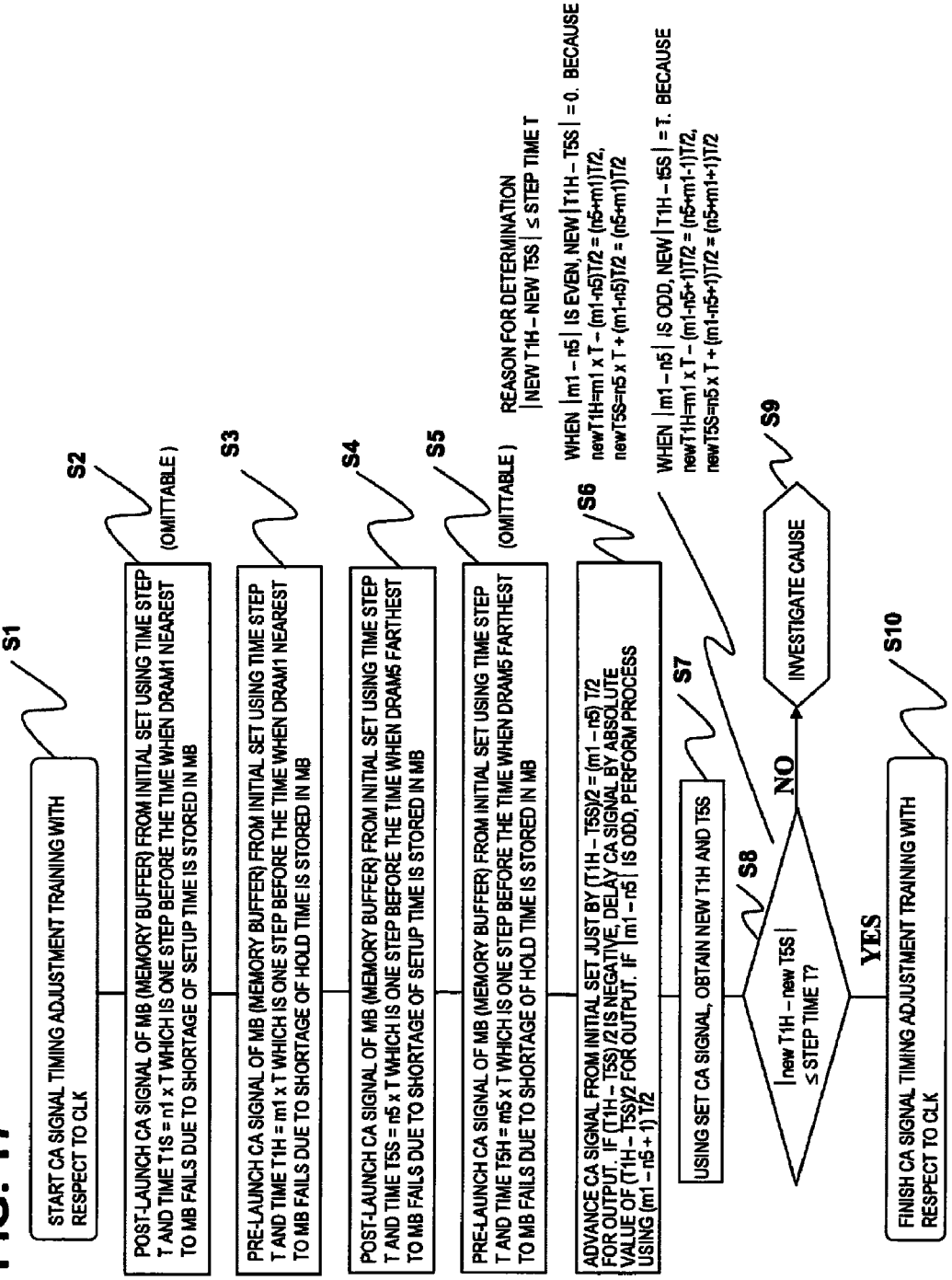

MEMORY MODULE

REFERENCE TO RELATED APPLICATION

This application is based upon and claims the benefit of the priority of Japanese patent application No. 2009-197267, filed on Aug. 27, 2009, the disclosure of which is incorporated herein in its entirety by reference thereto.

TECHNICAL FIELD

The present invention relates to a memory module.

BACKGROUND

A memory module such as a DIMM (Dual Inline Memory Module) has a configuration in which a plurality of memory chips such as DRAMs (Dynamic Random Access Memories) are mounted on a module board. The memory module is installed in a memory slot on a motherboard. Data transfer is performed between the memory module and a memory controller. Recently, it has become difficult to ensure a required memory capacity using one memory module due to an increase in the memory capacity demanded for a system. For this reason, it is a common practice that the motherboard has a plurality of memory slots, and a plurality of memory modules are installed in the plurality of memory slots. When the plurality of memory modules are installed, the load capacitance of a data line on the motherboard is increased and signal quality of the data line deteriorates. When a data transfer rate between the memory controller and the memory module is increased, there arises a problem that data transfer cannot be properly performed due to deterioration of signal quality caused by the load capacitance of the data line. In order to achieve high-speed data transfer on the order of 1.6 to 3.2 Gbps, for example, the load capacitance of the data line on the motherboard needs to be sufficiently reduced.

As a memory module in which the load capacitance of a data line can be reduced, a so-called Fully-Buffered type memory module is known (refer to Patent Document 1). In the Fully-Buffered type memory module, write data supplied from a memory controller is temporarily received by a dedicated chip referred to as an Advanced Memory Buffer (AMB), and the write data is supplied to a preset memory chip from the AMB. A read operation is opposite to the operation described above. All of read data output from a memory chip is temporarily supplied to the AMB, and is then supplied to the memory controller from the AMB.

Since the memory chip is not directly connected to the memory controller in the Fully-Buffered-type memory, the load capacitance of the data line of the memory chip cannot be seen from the memory controller (only the load capacitance of the AMB can be seen from the memory controller). As a result, the load capacitance of the data line connected to memory controller is greatly reduced.

However, since the AMB used in the Fully-Buffered-type memory module is a high-performance chip, the AMB is comparatively expensive and the power consumption of the AMB is also large. For this reason, there is a problem that the cost of the memory module greatly increases. Further, in the Fully-Buffered type memory module, an interface between the memory controller and the AMB (obtained by serialization and Point-to-Point connection of the interface between each of the modules) is different from a commonly used interface between the memory controller and the memory chip. Thus, there is also a problem that an off-the-shelf memory controller as it is cannot be used.

Under such a background, in recent years, a memory module referred to as a "Load Reduced type" (termed as an "LR-DIMM") has been proposed. In the LR-DIMM, a memory buffer is used in place of the AMB, and transferred data (DQ), a CA signal inclusive of command and address signals and so forth are buffered. An interface between a memory controller and the memory buffer is not changed from the common interface between the memory controller and a memory chip. Thus, low power consumption is achieved, and an off-the-shelf memory controller as it is can be used. FIG. 1 is a schematic diagram illustrating a configuration of the LR-DIMM. FIG. 1A shows the configuration of the LR-DIMM in the form of a perspective view, and a partially enlarged view in the vicinity of the memory buffer. FIG. 1B shows a side view of the configuration of the LR-DIMM. The configuration shown in FIG. 1 is set to have 3 DPC (DIMMs Per Channel)×3 channels. Namely, the LR-DIMM in FIG. 1 has 3 channels with 3 DIMMs per channel. Reference numeral 101 denotes a motherboard, reference numeral 102 denotes a memory controller, reference numeral 103 denotes a LR-DIMM (DIMM board), reference numeral 104 denotes a memory buffer on the DIMM103, reference numeral 105 denotes a DRAM (clock synchronous type DRAM) on the DIMM 103, reference numeral 106 denotes a data main bus (DQ MAIN bus) on the motherboard 101, reference numeral 107 denotes a DQ stub on the DIMM 103, reference numeral 108 denotes a stub resistor on the DIMM 103, and reference numeral 109 denotes a connector.

Referring to FIG. 1, the DIMM (LR-DIMM) 103 has DRAM chips 105 mounted on both surfaces of the DIMM board. One memory buffer 104 is provided for a plurality of the DRAM chips 105. The memory buffer (also termed as registered buffer) 104 captures each of data signal DQ, control signal CLTL and clock signal CLK which are supplied from the memory controller 102 through the connector 109, stub resistor 108, and DQ stub 107 on the DIMM 103, and performs wave-form shaping and amplification/buffering of each signal of DQ and so forth in synchronization with a timing of the clock signal to supply the resulting signal to the DRAM chip 105 on the DIMM 103.

FIG. 2 is a diagram showing flows of data signal DQ, data strobe signal DQS, CA (command, address) signal, CTRL signal, and clock signal CLK in the LR-DIMM 103 in FIG. 1. The signal indicated by a solid line indicates a (pre-buffered) signal before buffered by the memory buffer 104, and the signal indicated by a broken line indicates a (post-buffered) signal after buffered. The LR-DIMM 103 in FIG. 2 is set to have a 2R×4 configuration (where 2R indicates 2 ranks, while ×4 indicates a 4-bit chip), for example. The memory buffer 104 is arranged on one side of the DIMM board 103, on the other side of which DRAMs 1 are provided at the region opposed to the memory buffer 104. The memory buffer 104 supplies the buffered clock, buffered CA, buffered CTRL and buffered DQ signals to DRAMs 2 to 5 on the one side of the DIMM board 103, and supplies the buffered clock, buffered CA, buffered CTRL and buffered DQ signals to the DRAM 1 on the other side of the DIMM board 103 and the DRAMs 2 to 5 via through-holes.

[Patent Document 1]
JP Patent Kokai Publication No. JP-P2008-135597A

SUMMARY

The entire disclosure of Patent Document 1 is incorporated herein by reference thereto.
An analysis of the related art by the present invention will be given below.

FIG. 3A is a graph explaining delay states of the output signals of the memory buffer in FIG. 2. DRAM positions on a horizontal axis correspond to the DRAMs 1, 2, 3, 4, and 5 on the DIMM 103 in FIG. 2. A vertical axis indicates a delay time (expressed in picosecond). FIG. 3A shows delay states of arrival times of the CA signal (command, address), CLK signal, and CTRL signal (CS, CKE, ODT) at DRAM 5 from DRAM 1 (output pins of the memory buffer). The CTRL signal includes CS, CKE, and ODT signals, though not limited thereto. When the CS (Chip Select) signal is High, for example, chip selection is made. When the CKE (Clock Enable) signal is High, an internal clock is supplied. When the CKE signal is Low, the supply of the internal clock is stopped. The ODT (On Die Termination) signal controls on/off of setting of a termination resistance of a DQ pin, a DQS pin, and the like. As a delay of arrival at the DRAM 5, a delay exceeding 1000 ps is generated in the CA signal, a delay on the order of 700 to 800 ps is generated in the CLK signal, and a delay on the order of 500 ps is generated in the CTRL signal (CS, CKE, and ODT).

FIG. 3B is a diagram showing timing waveforms of signals CA, CTRL, and CLK output from the memory buffer 104 (inputs of the DRAM 1 in FIG. 2). One clock cycle is set to 937.5 ps in a DDR (Double Data Rate) 3-2133. Reference symbols t1S and t1H respectively indicate a setup time and a hold time at the position of the DRAM 1. The setup time is a period of time in which the value of a signal must be determined and held before an effective edge (such as a rising edge) of the CLK signal so that the signal is properly captured by a latch. The hold time is a period of time in which the value of the signal must be held after the effective edge (rising edge) of the CLK signal. FIG. 3C is a diagram showing timing waveforms of signals CA, CTRL, and CLK at DRAM 5 located at a far end. That is, the signals CA, CTRL, and CLK shown in FIG. 3C are signals at the time when the signals CA, CTRL, and CLK shown in FIG. 3B have propagated to the DRAM 5. As shown in FIG. 3C, due to a delay of the CA signal, the setup time t5S of the CA signal at the DRAM 5 becomes smaller than the setup time t1S of the CA signal at the DRAM 1. The hold time t5H of the CTRL signal at the DRAM 5 becomes smaller than the hold time 0H of the CTRL signal at the DRAM 1. That is, it can be seen that due to the difference in a propagation delay time difference among the relevant signals, the CA signal has no more setup margin which is a time margin of the setup time of the CA signal at the DRAM 5 and the CTRL signal has no more hold margin, namely a time margin of the hold time of the CTRL signal at the DRAM 5.

It is conceived that output of the CA signal may be advanced (pre-launched) so as to solve such a problem of no more margin. The CLK signal is always located at the center of the CTRL signal or a slightly pre-launched from the CTRL signal at the output pin of the buffer or the register.

Further, an adjustment time step of the CA signal is coarse, such as ⅙ or ¼ of one clock period tCK, or on the order of 100 ps to 150 ps.

As a result of the examination of configurations of scheduled entire cards (Raw cards), it has been found that, theoretically, delay (post-launch) of output of a CTRL signal in the LR-DIMM is necessary. Thus, in the present invention as will be described below, delaying the CTRL signal will be proposed.

A post-launch function for the CTRL signal has not been present in the Load Reduced memory module.

Further, a time step for time adjustment is coarse such as tCK/6 or tCK/4 (where tCK indicates one clock period), and is not suitable for the LR-DIMM. The data transfer rate of the LR-DIMM is increased to DDR3-1600/1866/2133 class, for example. For this reason, in the present invention, an optimal pre/post-launch time step will also be proposed.

In the present invention, automatic training for obtaining an optimal timing will also be proposed.

In order to solve one or more of the above-mentioned problems, the present invention is generally configured, though not limited thereto, as follows.

According to the present invention, there is provided a controller that includes a pre-launch circuit that advances an output timing of a command/address (CA) signal with respect to a clock signal; and a post-launch circuit that delays an output timing of a control (CTRL) signal with respect to the clock signal, the address/command signal having the output timing thereof adjusted by the pre-launch circuit and the control signal having the output timing adjusted by the post-launch circuit being transmitted to a plurality of memory chips.

According to the present invention, a pre/post-launch time step may be set to be equal to or less than tCK/32.

According to the present invention, a training function for obtaining an optimal timing is provided.

According to the present invention, the pre-launch function is implemented for the CA signal, and the post-launch function is implemented for the CTRL signal in a Load-Reduced memory module. A time adjustment resolution is set to be fine. The setup margin of the CA signal and the hold margin of the CTRL signal can be thereby ensured, so that operation stability and reliability during high-speed data transfer are improved.

Further, according to the present invention, a training function is implemented so that an optimal timing can be obtained on an actual system.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 1B is a side view;

FIG. 6 is a table showing a summary of trace loads (Trace loads) of each LR-DIMM raw card (Raw Card);

FIG. 7 is a diagram showing pin counts of the memory buffer;

FIGS. 8A, 8B, 8C, and 8D and FIGS. 8E, 8F, 8G, and 8H respectively show overviews of a 2R×8 topology and trace loads of a VLP/LP module and a 2R×4 topology and trace loads of an LP module;

FIGS. 9A, 9B, 9C, and 9D and FIGS. 9E, 9F, 9G, and 9H respectively show overviews of a 4R×8 topology and trace loads of an LP module and a 4R×4 topology and trace loads of an LP module;

FIGS. 11A, 11B, 11C, and 11D and FIGS. 11E, 11F, 11G, and 11H respectively show overviews of a 2R×4 topology and trace loads of a VLP/LP module and a 4R×8 topology and trace loads of a VLP/LP module;

FIGS. 12A, 12B, 12C, and 12D and FIGS. 12E, 12F, 12G, and 12H respectively show overviews of a 4R×4 topology and trace loads of a VLP module and a 8R×8 topology and trace loads of a VLP module;

FIG. 17 is a flowchart of CA signal timing adjustment with respect to a CLK signal;

PREFERRED MODES

Figure 2:
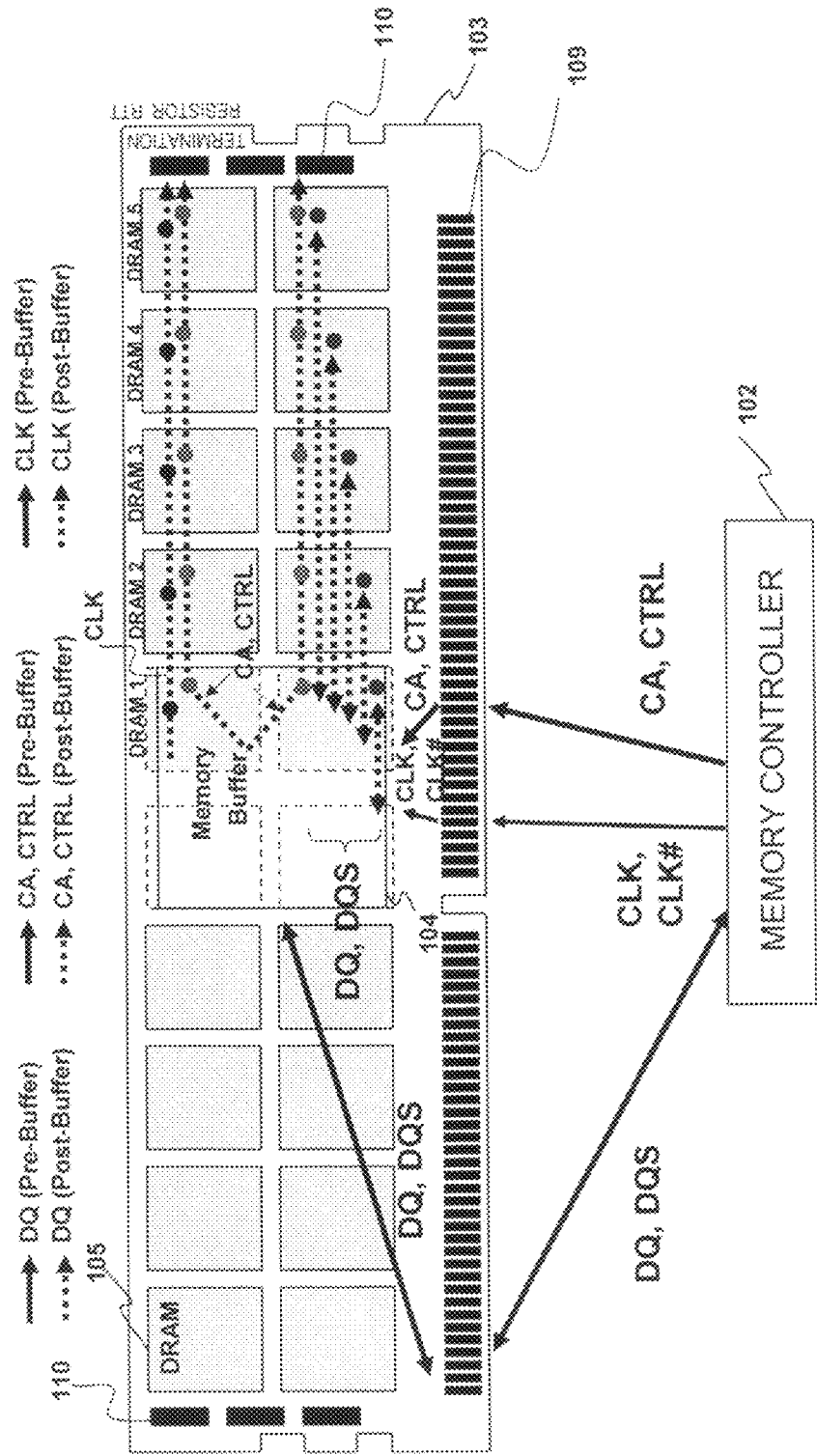
FIG. 2 is a diagram showing an overview of an LR-DIMM
Figure 4A:
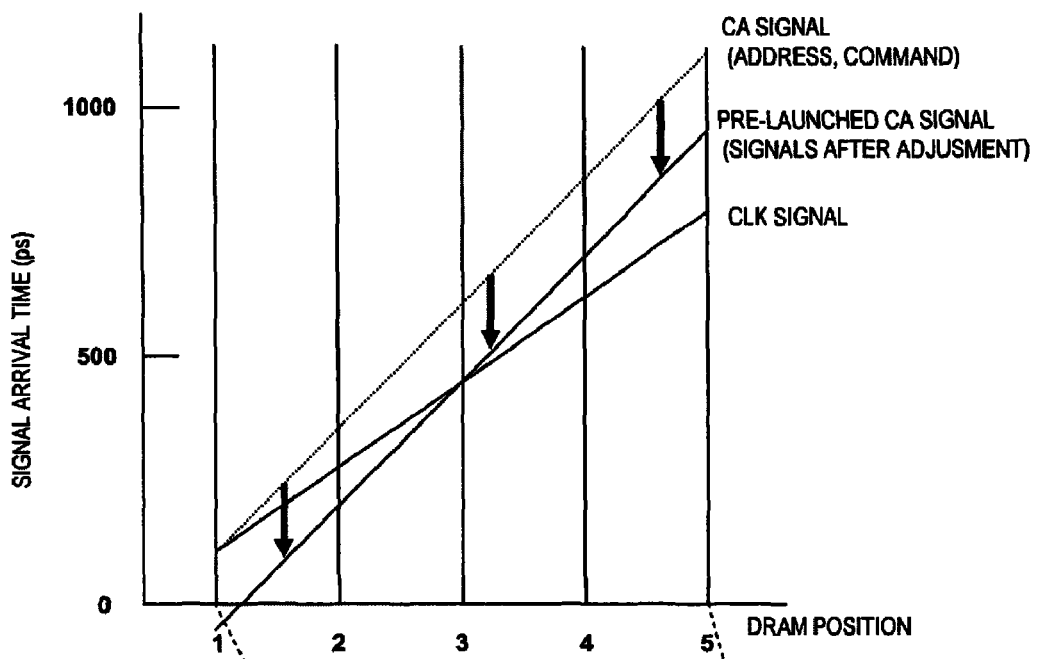
FIGS. 4A, 4B, and 4C are diagrams explaining a delay state of CA signal after adjustment in an exemplary embodiment of the present invention.
Figure 4B:
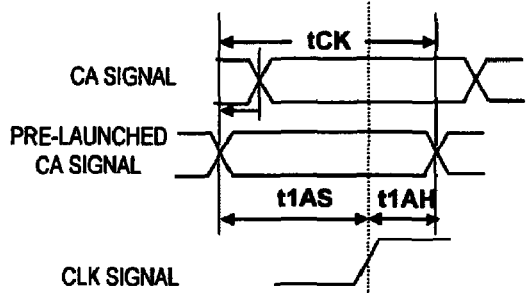
Figure 4C:
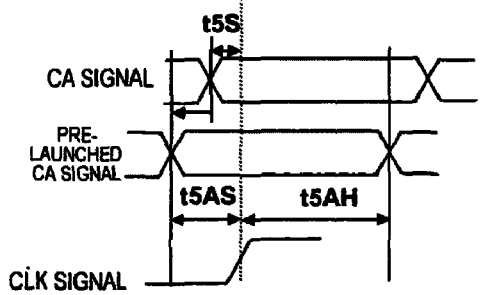

In accordance with one of preferred modes of the present invention, a pre-launch function for a CA signal (command and address), and a post-launch function for a CTRL signal is provided. FIGS. 4A, 4B, and 4C are diagrams explaining an exemplary embodiment of the present invention. FIG. 4A is a graph explaining a delay state of the CA signal after adjustment. A horizontal axis indicates positions of DRAM 1 to DRAM 5 in FIG. 2. A vertical axis indicates a delay time (expressed in picosecond). FIG. 4A shows a state of a delay of an arrival time at the DRAM 5 from the DRAM 1. FIG. 4B is a diagram showing respective timing waveforms of signals CA, pre-launched CA, and CLK at the DRAM 1 (or at output pins of the memory buffer)

Figure 1A:
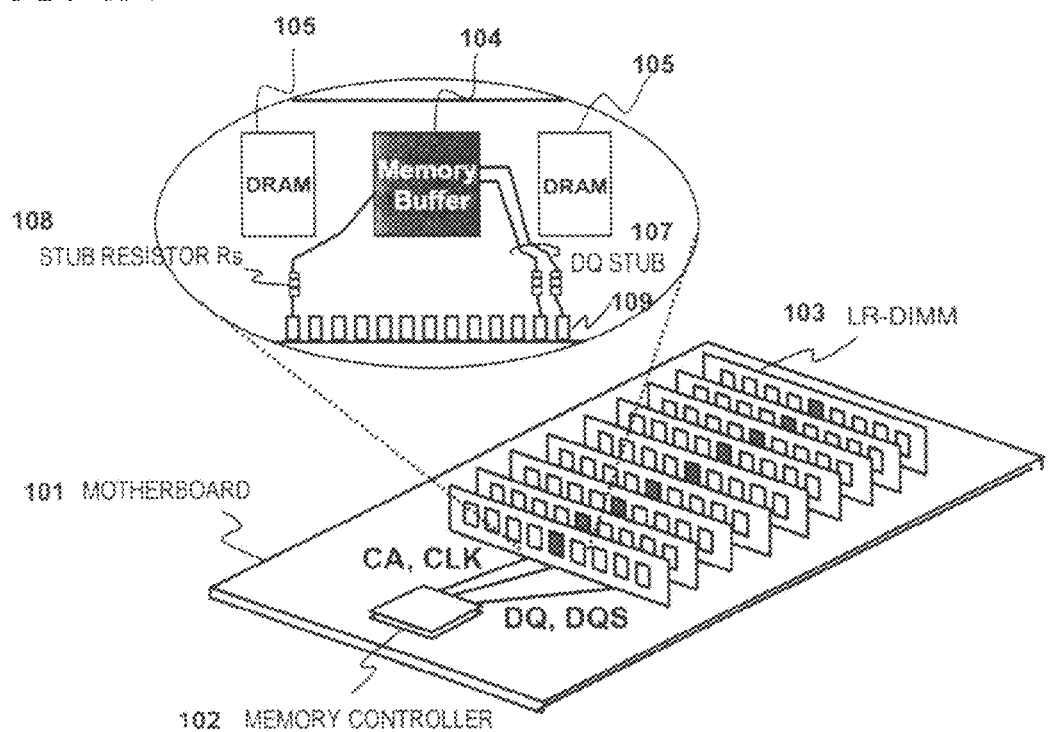
FIGS. 1A and 1B are diagrams showing an overview of an LR-DIMM system, in which FIG. 1A includes a perspective view and a partially enlarged view.
Figure 1B:
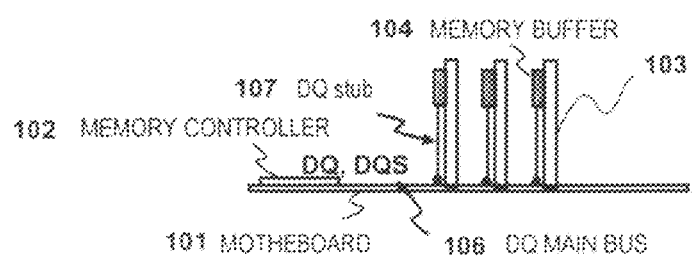

FIG. 4C is a diagram showing respective timing waveforms of signals CA, pre-launched CA, and CLK at the DRAM 5. When the CA signal is output earlier, namely pre-launched from the memory buffer (indicated by reference numeral 104 in FIG. 1, for example) so that the following equation (1) holds, a maximum margin can be obtained in an entire DIMM.

$$t1AH = t5AS \tag{1}$$

where t1AH is a hold time of the pre-launched CA signal at the DRAM 1, and t5AS is a setup time of the pre-launched CA signal at the DRAM 5.

Figure 3A:
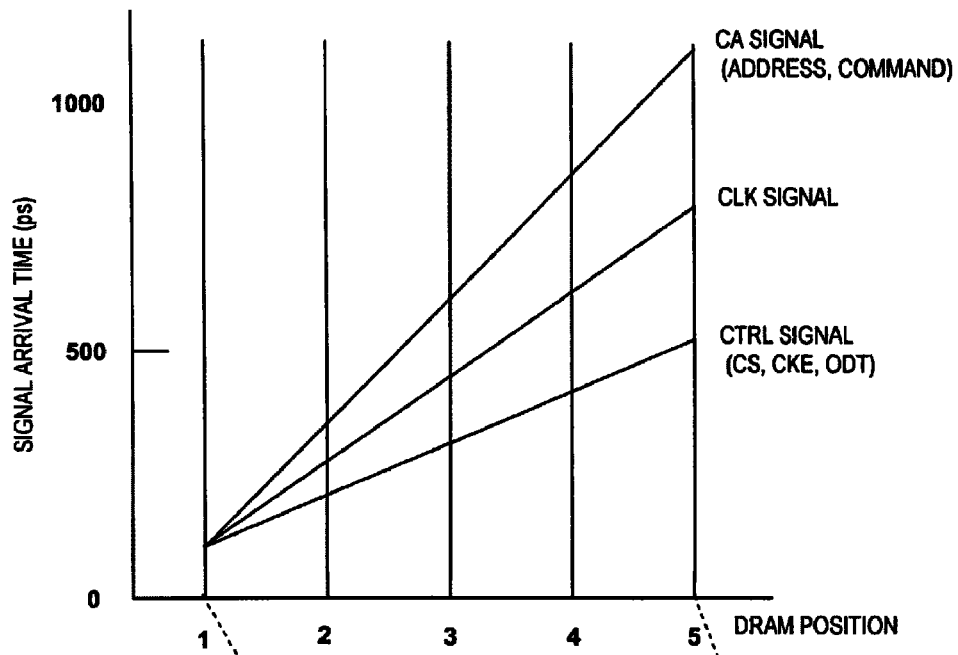
FIGS. 3A, 3B, and 3C are diagrams explaining delay states of output signals of a memory buffer (MB)
Figure 3B:
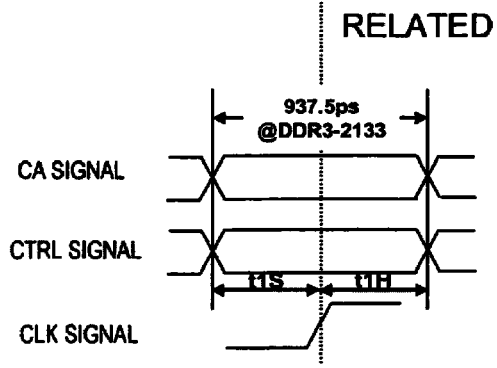
Figure 3C:
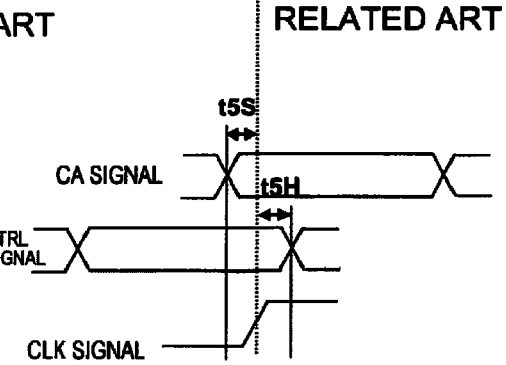

The setup time t5S of the CA signal at the position of the DRAM 5 in FIG. 4C is the same as a setup time t5S in FIG. 3C.

Figure 5A:
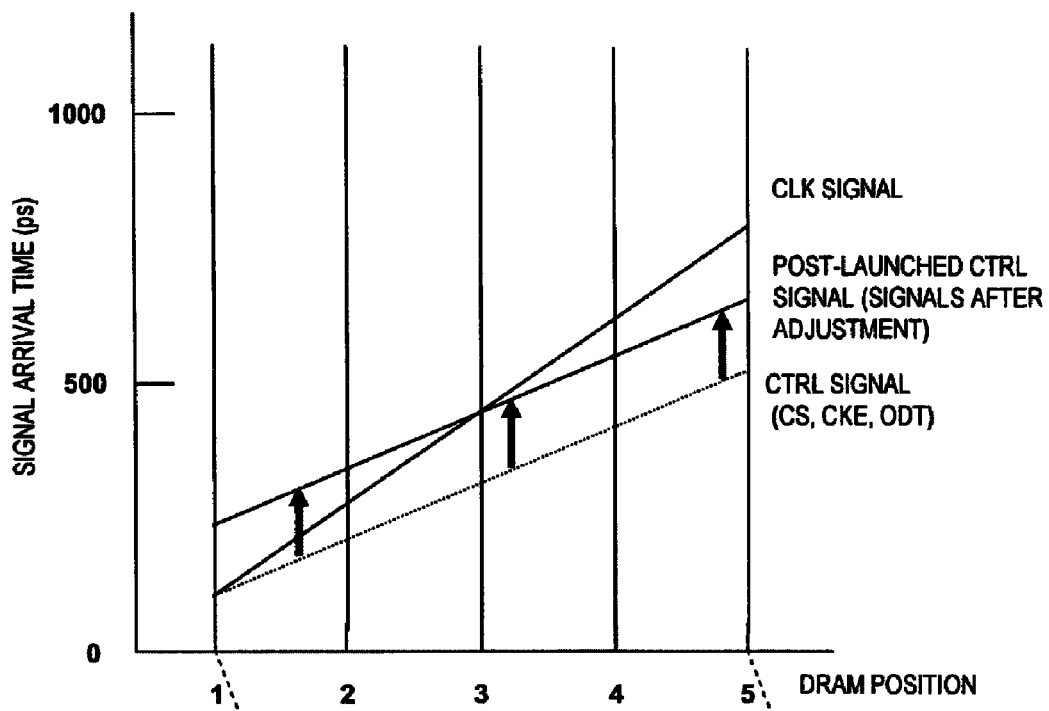
FIGS. 5A, 5B, and 5C are diagrams explaining a delay state of CTRL signal after adjustment in the exemplary embodiment of the present invention.
Figure 5B:
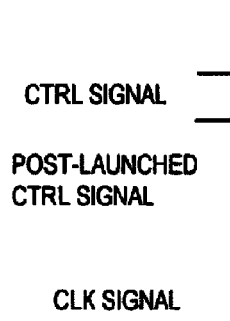
Figure 5C:
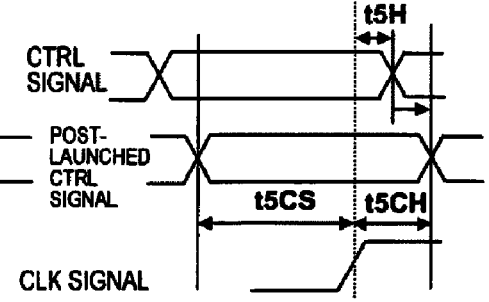

FIGS. 5A, 5B, and 5C are diagrams explaining the exemplary embodiment of the present invention. FIG. 5A is a graph explaining a delay state of the CTRL signal after timing adjustment. In FIG. 5A, a horizontal axis indicates the positions of the DRAM 1 to DRAM 5 in FIG. 2 and a vertical axis indicates a delay time. FIG. 5A shows a delay state of an arrival time at the DRAM 5 from the DRAM 1. FIG. 5B is a diagram showing timing waveforms of signals CTRL, post-launched CTRL and CLK at the DRAM 1. FIG. 5C is a diagram showing timing waveforms of signals CTRL, the post-launched CTRL and CLK at the DRAM 5. When the CTRL signal is delayed and is then output (post-launched) so that the equation (2) holds, a maximum margin can be obtained in the entire DIMM.

$$t1CS = t5CH \tag{2}$$

where, t1CS is a setup time of the post-launched CTRL signal at the DRAM 1, and t5CS is a hold time of the post-launched CTRL signal at the DRAM 5.

In this exemplary embodiment, the CA signal output from the memory buffer (MB) are set to be pre-launched, while the CTRL signal (CS, ODT, or CKE) output from the memory buffer (MB) are set to be post-launched. This exemplary embodiment allows the optimal timing to be obtained by training. That is, in this exemplary embodiment, the training function of obtaining the optimal timing is provided. The optimal timing can be thereby obtained on an actual system. A pre/post-launch time step used for obtaining the optimal timing by training in this exemplary embodiment is set to tCK/64 or less, for example.

A time step used for obtaining the optimal timing manually may be set to tCK/32 or less. The reason why the CA signal should only be pre-launched and the CTRL signal should only be post-launched will be described below.

FIG. 6 is an overall summary of trace loads of a Raw Card (which indicates a standard DIMM board defined by The JEDEC Solid State Technology Association) of each LR-DIMM. A trace load is defined to be a load connected for each unit length of one line. Since a plurality of layout methods are present, the notation such as a trace load 8-4 (equivalent to 8 or 4) is used in FIG. 6. An LP (Low Profile) module comprises a 2R×8, a 2R×4, a 4R×8, a 4R×4, an 8R×8, or an 8R×4 topology. A VLP (Very Low Profile) module comprises a 2R×8, a 2R×4, a 4R×8, a 4R×4, or an 8R×8 topology. The symbol ×8 denotes an 8-bit chip, while the symbol ×4 denotes a 4-bit chip. Reference symbol 2R denotes a dual rank (the rank being a set of DRAMs accessed at one time in the memory transfer). One DIMM supports two ranks. Reference symbols 4R and 8R respectively denote support of 4 and 8 ranks by one DIMM. Mono denotes a monolayer, DDP (Dual Die Package) denotes stacked layers of two DRAMs 2, and QDP (Quad Die Package) denotes stacked layers of four DRAMs.

A load of each of signals QCS, QODT, and QCKE is equal to or less than a load of a signal Y (CLK). For this reason, the signals QCS, QODT, and QCKE are post-launched on all occasions. A load of a signal QCA is equal to or more than the load of the signal Y (CLK). For this reason, the signal QCA is pre-launched on all occasions.

A propagation delay time tpd of a signal (delay (nonosecond) per one meter) is expressed by:

$$tpd(ns/m) = \sqrt{L0(C0+Cd)}$$

where L0 is an inductance (H/m) per line unit length, C0 is a capacitance (F/m) per line unit length, and Cd is a DRAM capacitance (F/m) per line unit length.

When a lot number of DRAMs are connected per a unit length of a line, the DRAM capacitance Cd per line unit length is increased. The propagation delay time tpd is thereby increased.

FIG. 7 is a diagram showing examples of pin list of CA system signal of the memory buffer 104 (refer to FIG. 1) output to the DRAM 105.

QACA denotes pins for the CA signal (for an address A0, A1, or the like) for left side, QBCA denotes pins for the CA signal (for an address A0, A1, or the like) for right side, QACS [3:0] denotes four pins (bits) for the CS (Chip Select) signal for left side, QBCS [3:0] denotes four pins (bits) for the CS (Chip Select) signal for right side, QAODT [1:0] denotes two pins (bits) for the ODT (On die Termination) signal for left side, QBODT [1:0] denotes two pins (bits) for the ODT (On die Termination) signal for right side, QAOCKE [3:0] denotes four pins (bits) for the CKE (Clock Enable) signal for left side, QBOCKE [3:0] denotes four pins (bits) for the CKE (Clock Enable) signal for right side, and Y [3:0]/Y [3:0] # denotes four pairs of pins for four pairs of the CLK signals (CLK, CLK #).

FIGS. 8 to 12 show examples of examination in which trace loads of all LR-DIMM Raw Cards are obtained, using the example of this pin count. FIG. 6 is a diagram showing the overall summary of these trace loads.

FIGS. 8A, 8B, and 8C are respectively a top view, a side view, and a side view seen from the right or left side of FIG. 8A of the LR-DIMM board of the VLP/LP module that comprises the 2R×8 topology, monolayer, and one row (1 Row) of DRAMs. These drawings indicate allocation of two ranks R0 and R1. FIG. 8D shows the respective trace loads of signals CA, CTRL (CS, ODT, or CKE), and Y (CLK).

FIGS. 8E, 8F, and 8G are respectively a top view, a side view, and a side view seen from the right or left side of FIG. 8E of the LR-DIMM board of the LP module that comprises the 2R×4 topology, monolayer, and two rows (2 Rows) of DRAMs. These drawings indicate allocation of two ranks R0 and R1. FIG. 8H shows respective trace loads of signals CA, CTRL (CS, ODT, or CKE), and Y (CLK).

FIGS. 9A, 9B, and 9C are respectively a top view, a side view, and a side view seen from the right or left side of FIG. 9A of the LR-DIMM board of the LP module that comprises the 4R×8 topology, monolayer, and two rows (2 Rows) of DRAMs. These drawings indicate allocation of four ranks R0, R1, R2, and R3. FIG. 9D shows respective trace loads of signals CA, CTRL (CS, ODT, or CKE), and Y (CLK).

FIGS. 9E, 9F, and 9G are respectively a top view, a side view, and a side view seen from the right or left side of FIG. 9E of the LR-DIMM board of the LP module that comprises the 4R×4 topology, two layers (2H Stack DDP), and two rows (2 Rows) of DRAMs. These drawings indicate allocation of four ranks R0, R1, R2, and R3. FIG. 9H shows respective trace loads of signals CA, CTRL (CS, ODT, or CKE), and Y (CLK).

Figure 10C:
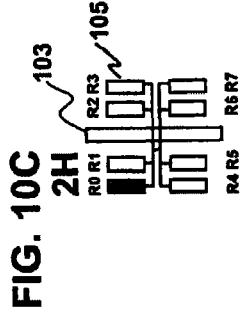
FIGS. 10A, 10B, 10C, and 10D and FIGS. 10E, 10F, 10G, and 10H respectively show overviews of an 8R×8 topology and trace loads of an LP module and an 8R×4 topology and trace loads of an LP module.
Figure 10D:
Figure 10G:
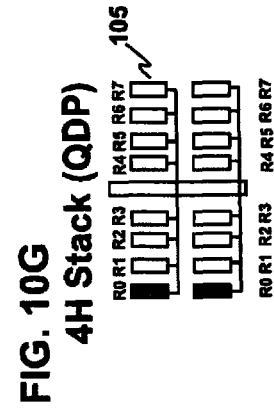
Figure 10H:
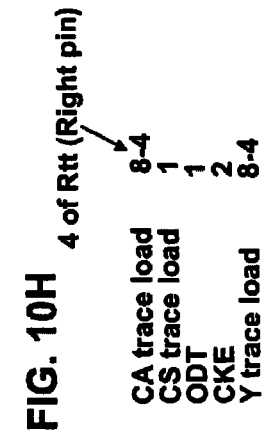
Figure 10A:
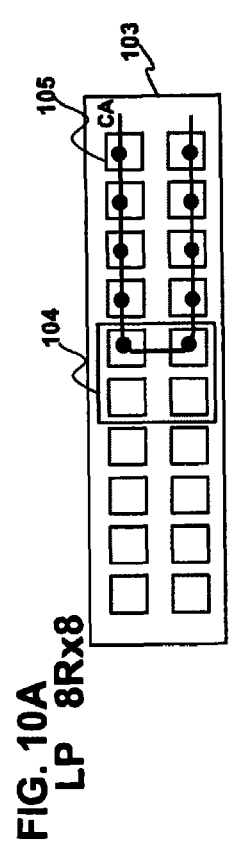
Figure 10B:
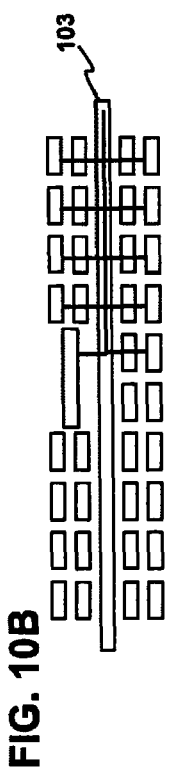

FIGS. 10A, 10B, and 10C are respectively a top view, a side view, and a side view seen from the right or left side of FIG. 10A of the LR-DIMM board of the LP module that comprises the 8R×8 topology, two layers (DDP), and two rows (2 Rows) of DRAMs. These drawings indicate allocation of eight ranks R0, R1, R2, and R3. FIG. 10D shows respective trace loads of signals CA, CTRL (CS, ODT, or CKE), and Y (CLK).

Figure 10E:
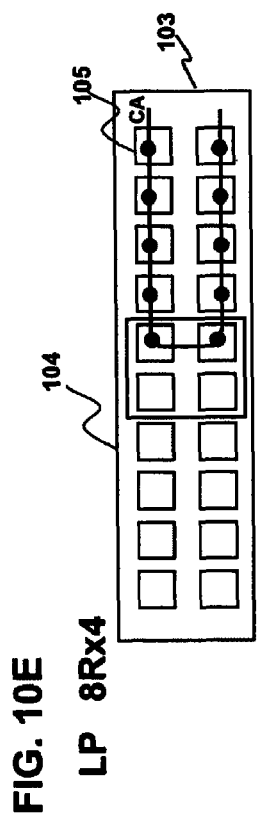
Figure 10F:
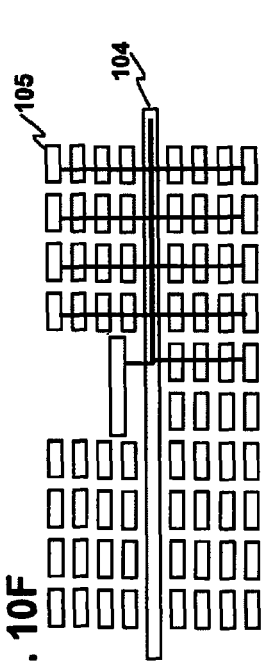

FIGS. 10E, 10F, and 10G are respectively a top view, a side view, and a side view seen from the right or left side of FIG. 10E of the LP module that comprises the 8R×4 topology, four layers (4H Stack (QDP)), and two rows (2 Rows) of DRAMs. These drawings indicate allocation of eight ranks R0 to R7. FIG. 10H shows respective trace loads of signals CA, CTRL (CS, ODT, or CKE), and Y (CLK). In CA-trace load 8-4, 4 corresponds to termination resistors Rtt (indicated by reference numeral 110 in FIG. 2).

FIGS. 11A, 11B, and 11C are respectively a top view, a side view, and a side view seen from the right or left side of FIG. 11A of the VLP/LP module that comprises the 2R×4 topology, two layers (DDP), and one row (1 Row) of DRAMs. These drawings indicate allocation of two ranks R0 and R1. FIG. 11D shows respective trace loads of signals CA, CTRL (CS, ODT, or CKE), and Y (CLK).

FIGS. 11E, 11F, and 11G are respectively a top view, a side view, and a side view seen from the right or left side of FIG. 11E of the VLP/LP module that comprises the 4R×8 topology, two layers (2H Stack DDP), and one row (1 Row) of DRAMs. These drawings indicate allocation of eight ranks R0 to R7. FIG. 11H shows respective trace loads of signals CA, CTRL (CS, ODT, or CKE), and Y (CLK).

FIGS. 12A, 12B, and 12C are respectively a top view, a side view, and a side view seen from the right or left side of FIG. 12A of the VLP module that comprises the 4R×4 topology, four layers (QDP), and one row (1 Row) of DRAMs. These drawings indicate allocation of four ranks R0, R1, R2, and R3. FIG. 12D shows respective trace loads of signals CA, CTRL (CS, ODT, or CKE), and Y (CLK).

FIGS. 12E, 12F, and 12G are respectively a top view, a side view, and a side view seen from the right or left side of FIG. 12E of the VLP module that comprises the 8R×8 topology, four layers (4H Stack QDP), and one row (1 Row) of DRAMs. These drawings indicate allocation of four ranks R0 to R3. FIG. 12H shows respective trace loads of signals CA, CTRL (CS, ODT, or CKE), and Y (CLK).

Figure 13:
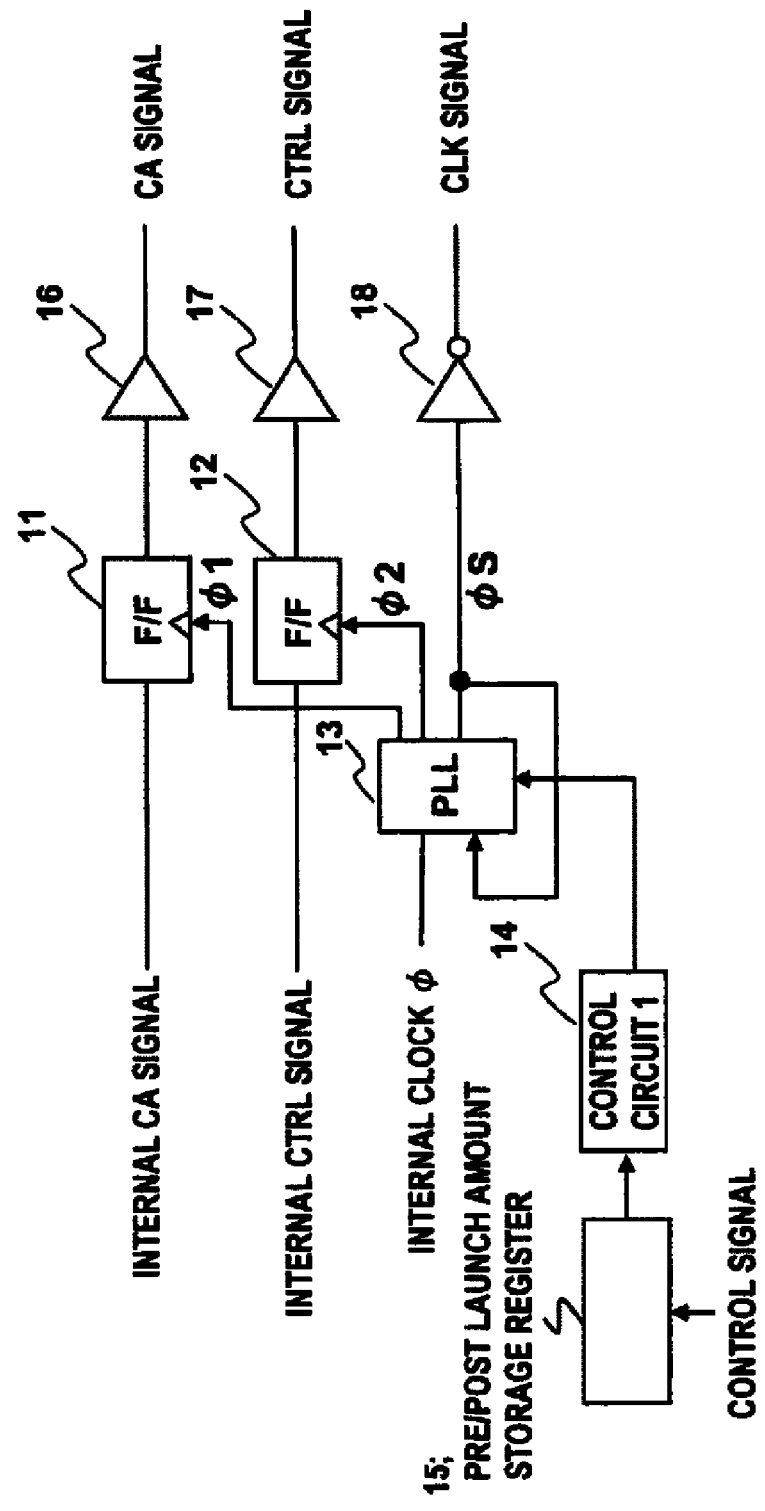
FIG. 13 is a diagram showing a configuration of a pre/post launch circuit in an example of the present invention.

FIG. 13 is a diagram showing a circuit configuration of pre-launching of the CA signal and post-launching of the CTRL signal in the memory buffer 104 (in FIGS. 1 and 2) according to the present exemplary embodiment. An internal CA signal, an internal CTRL signal, and an internal clock $\phi$ in the memory buffer 104 are signals of a CA signal, a CTRL signal, and a clock signal $\phi$ transmitted from the memory controller and received by the memory buffer 104. The memory buffer 104 includes flip-flops (sampling circuits) 11 and 12, buffers 16 and 17, a PLL (phase-locked loop) circuit 13, an inverting buffer 18, a first control circuit 14 and a pre-launch amount and post-launch amount storage register 15. The internal CA signal is output as the CA signal of the memory buffer 104 through the flip-flop 11 and the buffer 16. The internal CTRL signal is output as the CTRL signal of the memory buffer 104 through the flip-flop 12 and the buffer 17. The internal clock $\phi$ is supplied to the PLL circuit 13, and an output signal $\phi S$ is output as the CLK signal of the memory buffer 104 through the inverting buffer 18. For simplicity, FIG. 13 shows the internal CA signal as one signal line, and shows that one input signal is supplied to the flip-flop 11 and one output signal is output from the flip-flop 11. The internal CA signal has plurality of bits (address and command), and the signals of the plurality of bits are supplied to the flip-flops (register) 11 in parallel, and are sampled and output in parallel in synchronization in a signal (sampling clock signal) $\phi 1$ supplied from the PLL 13. Similarly, the internal CTRL signal has a plurality of bits (CS, CKE, and ODT and the like). The signals of the plurality of bits are supplied to the flip-flops (resister) 12 in parallel, and sampled and output in parallel in synchronization with a signal (sampling clock signal) φ2 supplied from the PLL 13. The first control circuit 14 receives a pre-launch amount (phase advance amount) and a post-launch amount (phase delay amount) from the pre-launch amount and post-launch amount storage register 15 to supply a control signal to the PLL circuit 13. The PLL circuit 13 outputs the signal φ1 with a phase thereof advanced from the internal clock φ, corresponding to the pre-launch amount, the signal φ2 with a phase thereof delayed from the internal clock φ, corresponding to the post-launch amount, and the signal φS with a phase thereof synchronized with the internal clock φ.

A known configuration is used for the PLL circuit 13. That is, the PLL circuit 13 includes a phase detector (PD) that detects a phase difference between the internal clock φ and the output signal φS, a charge pump (CP) that generates a voltage corresponding to a result of detection by the phase detector (PD), an LPF (Loop Filter) that smoothes an output of the charge pump (CP), and a voltage controlled oscillator (VCO) that receives an output voltage of the LPF as a control voltage, for example. The phase detector, charge pump, LPF, and voltage controlled oscillator in the PLL 13 are not shown. The voltage controlled oscillator (VCO) varies an oscillation frequency according to the received control voltage from the LPR, and outputs the signal φS with the phase thereof synchronized with the internal clock φ. In this example, according to the control signal from the first control circuit 14, the PLL circuit 13 outputs the signal φ1 of which a phase advance amount with respect to the signal φS is variably set and controlled, and also outputs the signal φ2 of which a phase delay amount with respect to the signal φS is variably set and controlled. The voltage controlled oscillator (VCO) of the PLL circuit 13 may include a ring oscillator obtained by ring-connecting an odd number of stages of inverters with delays thereof varied by the control signal. In this ring oscillator, two stages of the inverters produce a unit delay. Then, for extraction of the signals φ1 and φ2, tap selection may be made from among positions (taps) each located corresponding to integer times of the unit delay with respect to a position (tap) from which the signal φS is extracted, according to the control signal. The signals φS, φ1, and φ2 may be thereby generated.

The flip-flop 11 samples and outputs the internal CA signal, in response to the signal φ1 with the phase thereof advanced from the internal clock φ. The flip-flop 12 samples and outputs the internal CTRL signal, in response to the signal φ2 with the phase thereof delayed from the internal clock φ.

Figure 14:
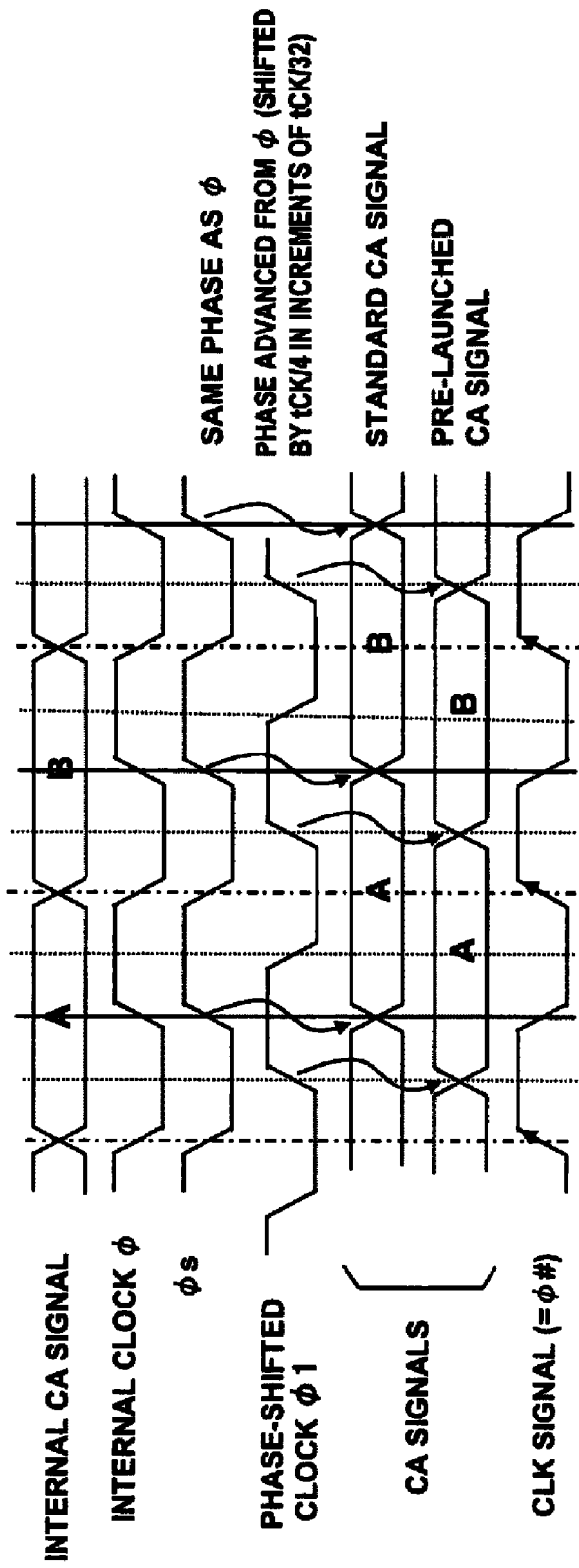
FIG. 14 is a diagram showing a time chart of CA signal in FIG. 13.

FIG. 14 is a timing chart of the CA signal in the circuit in FIG. 13. The standard CA signal is obtained by sampling the internal CA signal responsive to a rising edge of the output clock φs of the PLL circuit 13. The pre-launched CA signal is obtained by sampling the internal CA signal at the flip-flop 11 responsive to a rising edge of the output clock φ1 (signal obtained by advancing the phase of the internal clock φ) of the PLL circuit 13. The standard CA signal changes at a time when the CLK signal (φ#, or inversion of the clock φ) falls. The pre-launched CA signal changes earlier than the time when the CLK signal (φ#, or inversion of the internal clock φ) falls.

Figure 15:
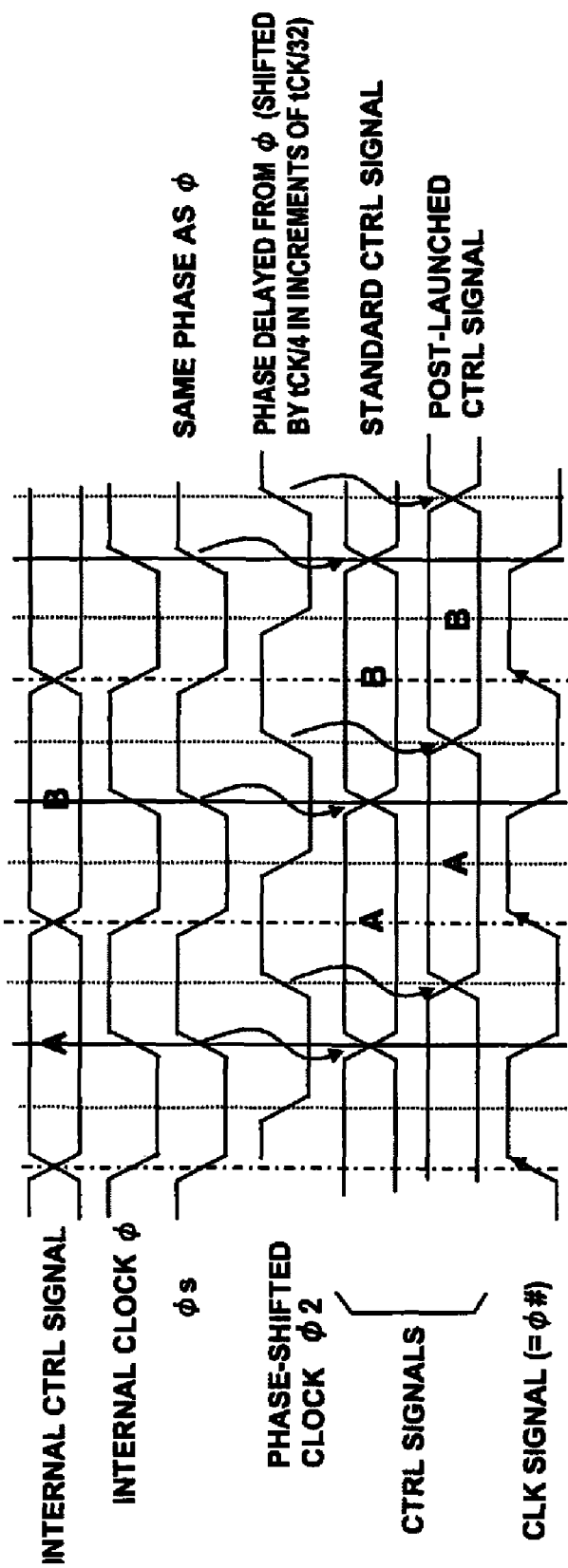
FIG. 15 is a diagram showing a time chart of CTRL signal in FIG. 13.

FIG. 15 is a timing chart of the CTRL signal in the circuit in FIG. 13. The standard CTRL signal is obtained by sampling the internal CTRL signal responsive to a rising edge of the output clock φs of the PLL circuit 13. The pre-launched CA signal is obtained by sampling the internal CTRL signal by the flip-flop 12 responsive to a rising edge of the output clock φ2 (signal obtained by delaying the phase of the internal clock φ) of the PLL circuit 13. The standard CTRL signal changes at a time when the CLK signal (φ#, or inversion of the internal clock φ) falls. The post-launched CTRL signal changes later than the time when the CLK signal (φ#, or inversion of the internal clock φ) falls.

In the above-mentioned example, when an LR-DIMM board is designed (for placement and routing), an optimal pre-launch amount or an optimal post-launch amount is determined. Then, the value of the optimal pre-launch or post-launch amount is stored in the pre/post launch amount storage register 14 of the memory buffer 104. The pre-launch amount and the post-launch amount may be of course stored and held in a rewritable non-volatile memory or the like (not shown).

Figure 16A:
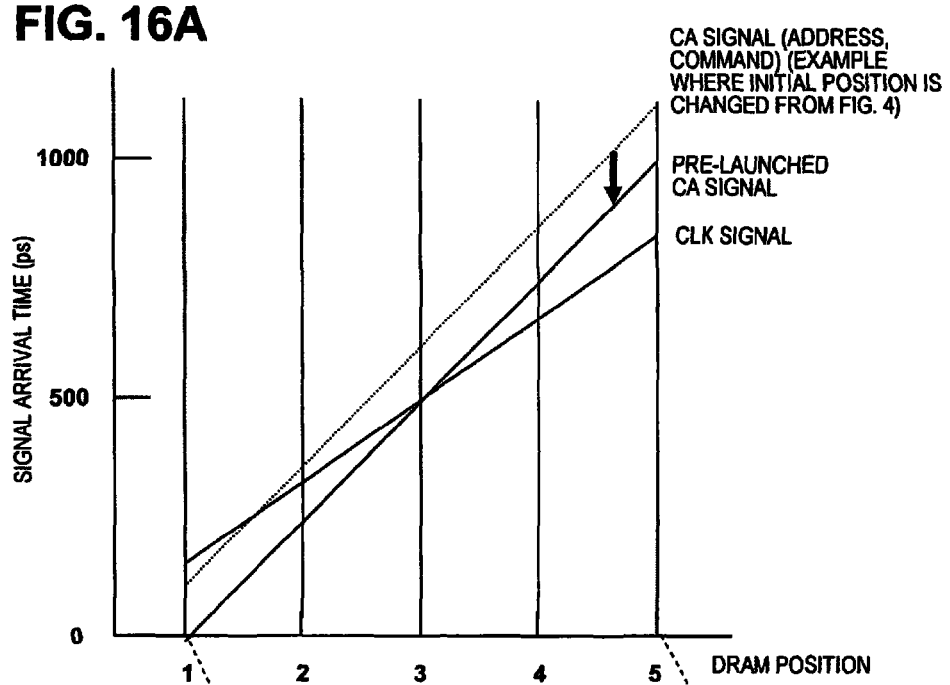
FIGS. 16A, 16B, and 16C are diagrams explaining CA signal timing optimization by training.
Figure 16B:
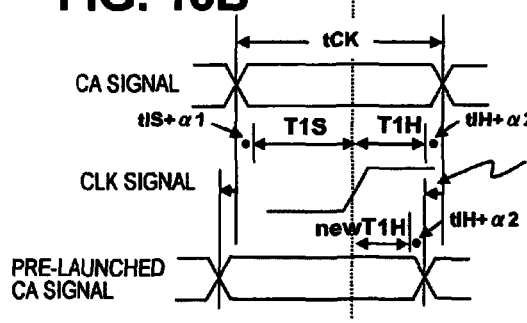
Figure 16C:
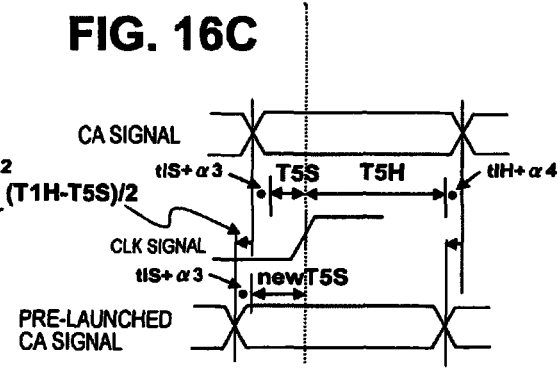

In another example of the present invention, the optimal pre-launch amount and the optimal post-launch amount are obtained by training. FIGS. 16A, 16B, and 16C are diagrams explaining timing optimization of the CA signal by training. FIGS. 16A, 16B, and 16C respectively correspond to FIGS. 4A, 4B, and 4C. FIGS. 16A, 16B, and 16C show an example where an initial set value of the CA signal is different from that in the example of FIGS. 4A, 4B, and 4C.

FIG. 17 is a flowchart showing CA signal timing adjustment training with respect to the CLK signal.

The CA signal timing adjustment training with respect to the CLK signal is started (in step S1).

The CA signal that is output from the memory buffer 104 are post-launched from the initial set value using a particular time step T, and a time T1S=n1×T (refer to FIG. 16B) which is one time step before the time at which a DRAM 1 closest to the memory buffer 104 fails because of shortage of a setup time is stored in the memory buffer 104 (in step S2, which may be omitted). That is, if the CA signal is post-launched with a time (n1+1)×T, DRAM 1 closest to the memory buffer 104 fails because of shortage of a setup time, while if the CA signal is post-launched with a time n1×T, DRAM 1 does not fail because of shortage of a setup time.

The CA signal that is output from the memory buffer 104 are pre-launched from the initial set value using the particular time step T, and a time T1H=m1×T (refer to FIG. 16B) which is one time step T before the time at which the DRAM 1 closest to the memory buffer 104 fails because of shortage of a hold (Hold) time is stored in the memory buffer 104 (in step S3).

The CA signal that is output from the memory buffer 104 are post-launched from the initial set value using the particular time step T, and a time T5S=n5×T (refer to FIG. 16C) which is one time step before the time at which a DRAM 5 farthest to the memory buffer 104 fails once because of shortage of the setup time is stored in the memory buffer 104 (in step S4).

The CA signal that is output from the memory buffer 104 are pre-launched from the initial set value using the particular time step T, and a time T5H=m5×T (refer to FIG. 16C) which is one time step before the time at which the DRAM 5 farthest to the memory buffer 104 fails once because of shortage of the hold (Hold) time is stored in the memory buffer 104 (in step S5, which may be omitted).

Using the times T1H, T5H obtained in steps S3 and S4, the CA signal is output earlier from the initial set value by a time expressed as follows:

$$(T1H - T5S)/2 = (m1 - n5)T/2$$

When (T1H−T5S)/2 is negative, the CA signal is delayed by an absolute value of |m1−n5|T/2 and are then output.

When the value of |m1−n5| is odd, the process is performed using (m1−n5+1)T/2 (in step S6). When m1−n5 is positive odd, the CA signal is output earlier from the initial set value just by (m1−n5+1)T/2. When m1−n5 is negative odd, the CA signal is delayed from the initial set value just by |(m1−n5+1)|T/2 and are then output.

Using the CA signal that has been set as describe above, a time T1H (newT1H shown in FIG. 16B) and a time T5S (newT5S shown in FIG. 16C) are newly obtained (in step S7).

Next, it is determined whether or not |newT1H−newT5S|≦time step T (in step S8).

When a result of determination in step S8 is No, or when |newT1H−newT5S|>time step T, the cause of this relationship is investigated (in step S9).

When the result of determination in step S8 is Yes, the CA signal timing adjustment training with respect to the CLK signal is finished (in step S10).

Next, the determination of |newT1H−newT5S|≦time step T in step S8 will be described.

When |m1−n5| is even, |newT1H−newT5S|=0 holds.

$$\text{Because new } T1H = m1 \times T - (m1 - n5)T/2$$
$$= (n5 + m1)T/2$$
$$newT5S = n5 \times T + (m1 - n5)T/2$$
$$= (n5 + m1)T/2$$

On the other hand, when |m1−n5| is odd, |newT1H−newT5S|=T holds.

$$\text{Because new } T1H = m1 \times T - (m1 - n5 + 1)T/2$$
$$= (n5 + m1 - 1)T/2$$
$$newT5S = n5 \times T + (m1 - n5 + 1)T/2$$
$$= (n5 + m1 + 1)T/2$$

Figure 18A:
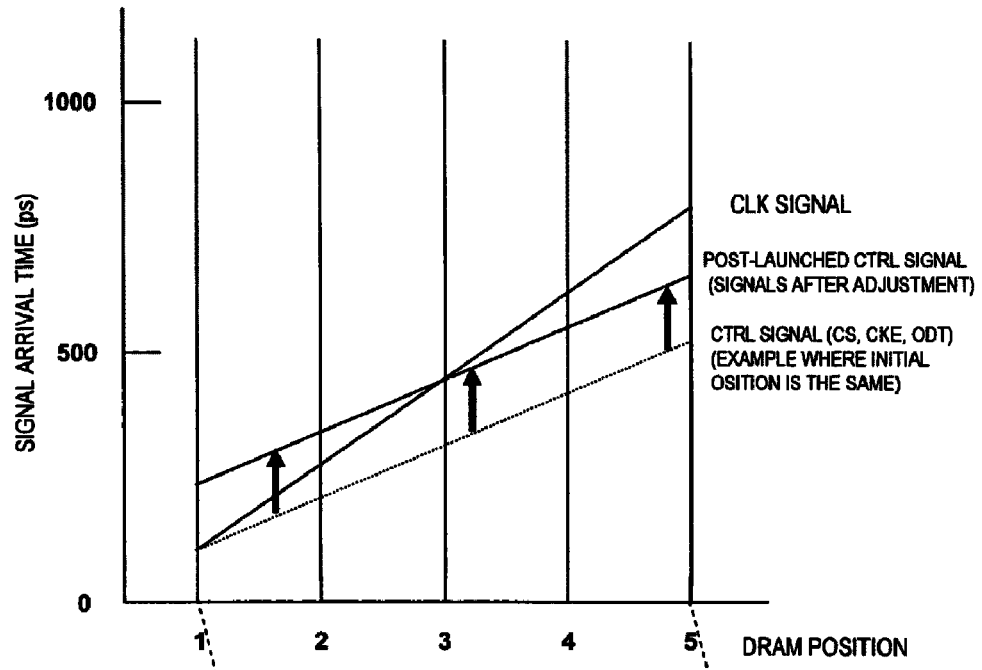
FIGS. 18A, 18B, and 18C are diagrams explaining CTRL signal timing adjustment by training.
Figures 18B, 18C:
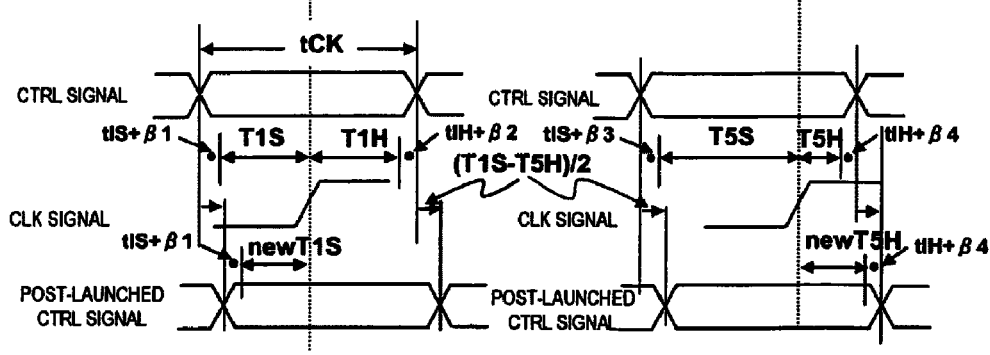

FIGS. 18A, 18B, and 18C are diagrams explaining CTRL signal timing optimization by training. FIGS. 18A, 18B, and 18C respectively correspond to FIGS. 5A, 5B, and 5C. FIGS. 18A, 18B, and 18C show an example where an initial set value of the CTRL signal is the same as the example of FIGS. 5A, 5B, and 5C.

Figure 19:
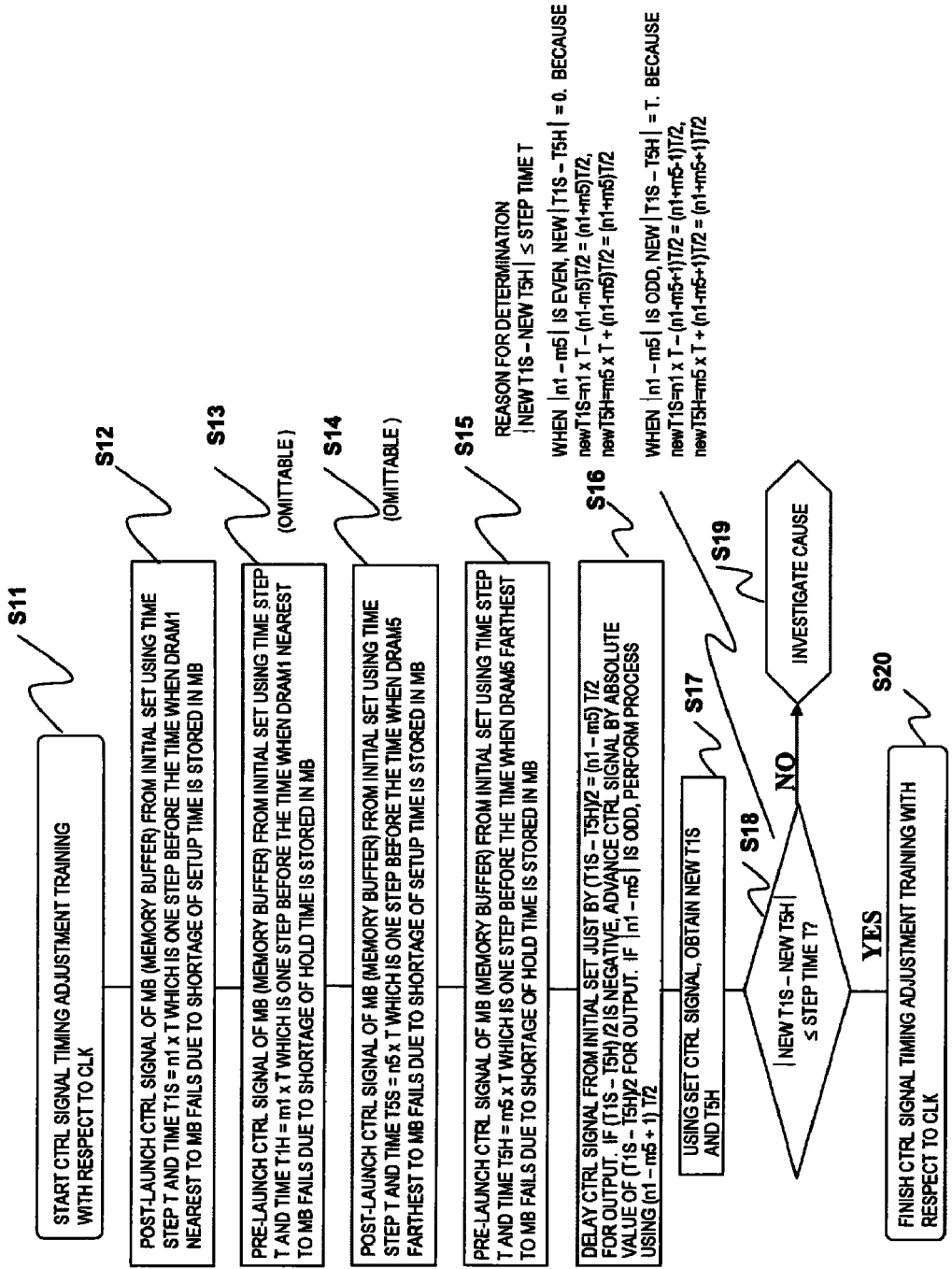
FIG. 19 is a flowchart of CTRL signal timing adjustment with respect to the CLK signal.

FIG. 19 is a flowchart showing CTRL signal timing adjustment training with respect to the CLK signal.

The CTRL signal timing adjustment training with respect to the CLK signal is started (in step S11).

The CTRL signal output from the memory buffer 104 is post-launched from the initial set value using the particular time step T, and a time T1S=n1×T (refer to FIG. 18B) which is one time step before the time at which DRAM 1 closest to the memory buffer 104 fails once because of shortage of a setup time is stored in the memory buffer 104 (in step S12).

The CTRL signal output from the memory buffer 104 is pre-launched from the initial set value using the particular time step T, and a time T1H=m1×T (refer to FIG. 18B) which is one time step T before the time at which the DRAM 1 closest to the memory buffer 104 fails because of shortage of a hold (Hold) time is stored in the memory buffer 104 (in step S13, which may be omitted).

The CTRL signal output from the memory buffer 104 is post-launched from the initial set value using the particular time step T, and a time T5S=n5×T (refer to FIG. 18C) which is one time step T before the time at which the DRAM 5 farthest to the memory buffer 104 fails once because of short- age of the setup time is stored in the memory buffer 104 (in step S14, which may be omitted).

The CTRL signal from the memory buffer 104 is pre-launched from the initial set value using the particular time step T, and a time T5H=m5×T (refer to FIG. 18C) which is one time step T before the time at which the DRAM 5 farthest to the memory buffer 104 fails because of shortage of the setup time is stored in the memory buffer 104 (in step S15).

Using the times T1H, T5H obtained in steps S12 and S15, the CTRL signal is output delayed from the initial set value just by a time expressed as follows:

$$(T1S-T5H)/2=(n1m5)T/2$$

When the time (T1S−T5H)/2 is negative, the CTRL signal is advanced from the initial set value by an absolute value of |(n1−m5)|T/2 and are then output. When the value of |n1−m5| is odd, the process is performed using (n1−m5+1)T/2 (in step S16). When (n1−m5) is positive odd, the CTRL signal is output delayed from the initial set value just by (n1−m5+1)T/2. When (n1−m5) is negative odd, the CTRL signal is advanced from the initial set value just by |(n1−m5+1)|T/2 and are then output.

Using the CTRL signal that has been set, a time T1S (newT1S) and a time T5H (newT5H) are newly obtained (in step S17).

Next, it is determined whether or not |newT1S−newT5H|≦time step T (in step S18).

When a result of determination in step S18 is No, or when |newT1S−newT5H|>time step T, the cause of this relationship is investigated (in step S19).

When the result of determination in step S18 is Yes, the CTRL signal timing adjustment training with respect to the CLK signal is finished (in step S20).

Next, the reason for determination of |newT1S−newT5H|≦time step T in step S18 will be described.

When |n1−m5| is even, new|T1S−T5H|=0 holds.

$$\text{Because new } T1S = n1 \times T - (n1 - m5)T/2$$
$$= (n1 + m5)T/2$$
$$newT5H = m5 \times T + (n1 - m5)T/2$$
$$= (n1 + m5)T/2$$

On the other hand, when |n1−m5| is odd, new|T1S−T5H|=T holds.

$$\text{Because new } T1S = n1 \times T - (n1 - m5 + 1)T/2$$
$$= (n1 + m5 - 1)T/2$$
$$newT5H = m5 \times T + (n1 - m5 + 1)T/2$$
$$= (n1 + m5 + 1)T/2$$

Figure 20:
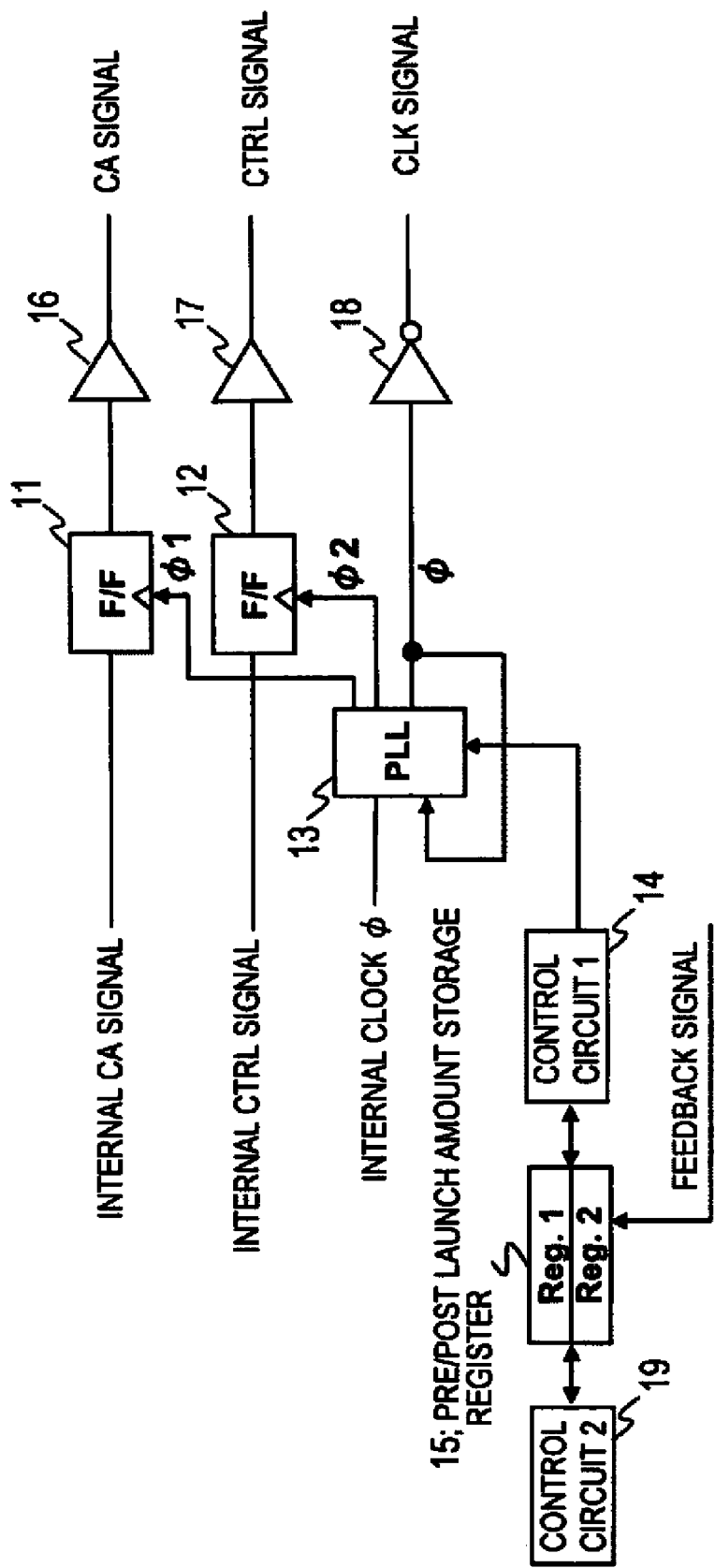
FIG. 20 is a diagram showing a configuration of a pre/post launch circuit in another example of the present invention.

FIG. 20 is a diagram showing a configuration of this example. Referring to FIG. 20, a (second) control circuit 19 is added to the configuration in FIG. 13, and a pre/post launch amount storage register 15 includes registers 1 and 2. Referring to the circuit in FIG. 20, a circuit operation of CA signal training corresponding to FIG. 17 will be described.

The phase of a clock φ1 at a DRAM 1 closest to a memory buffer 104 is advanced in increments of a time step T by a first control circuit (14). A time step total T1H=m1×T which is one time step before the time at which the DRAM 1 fails because of shortage of a hold time is stored in a pre/post launch amount storage Register 1 by a feedback signal. Similarly, the phase of the clock φ1 is delayed in increments of the time step T, and a time step total T5S=n5×T which is one step before the time at which the DRAM 5 fails once because of shortage of a setup time is stored in the pre/post launch amount storage Register 1. The time step totals T1H and T5S are sent to the second control circuit (19). The second control circuit (19) calculates an optimal shift amount (T1H−T5S)/2, and the value of the optimal shift amount (T1H−T5S)/2 is stored in the pre/post launch amount storage register 15 in the memory buffer 104.

Next, under the optimal relationship between the CA signal and the clock φ1, time step totals T1H and T5S are newly obtained. The second control circuit (19) determines whether |new T1H−new T5S|≦T. When the determination is YES, the training is finished. The similar operation is performed for CTRL signal (about a post-launch amount with respect to a clock φ2). The pre-launch amount and the post-launch amount may be of course stored and held by a rewritable nonvolatile memory or the like (not shown) in this example.

Figure 21:
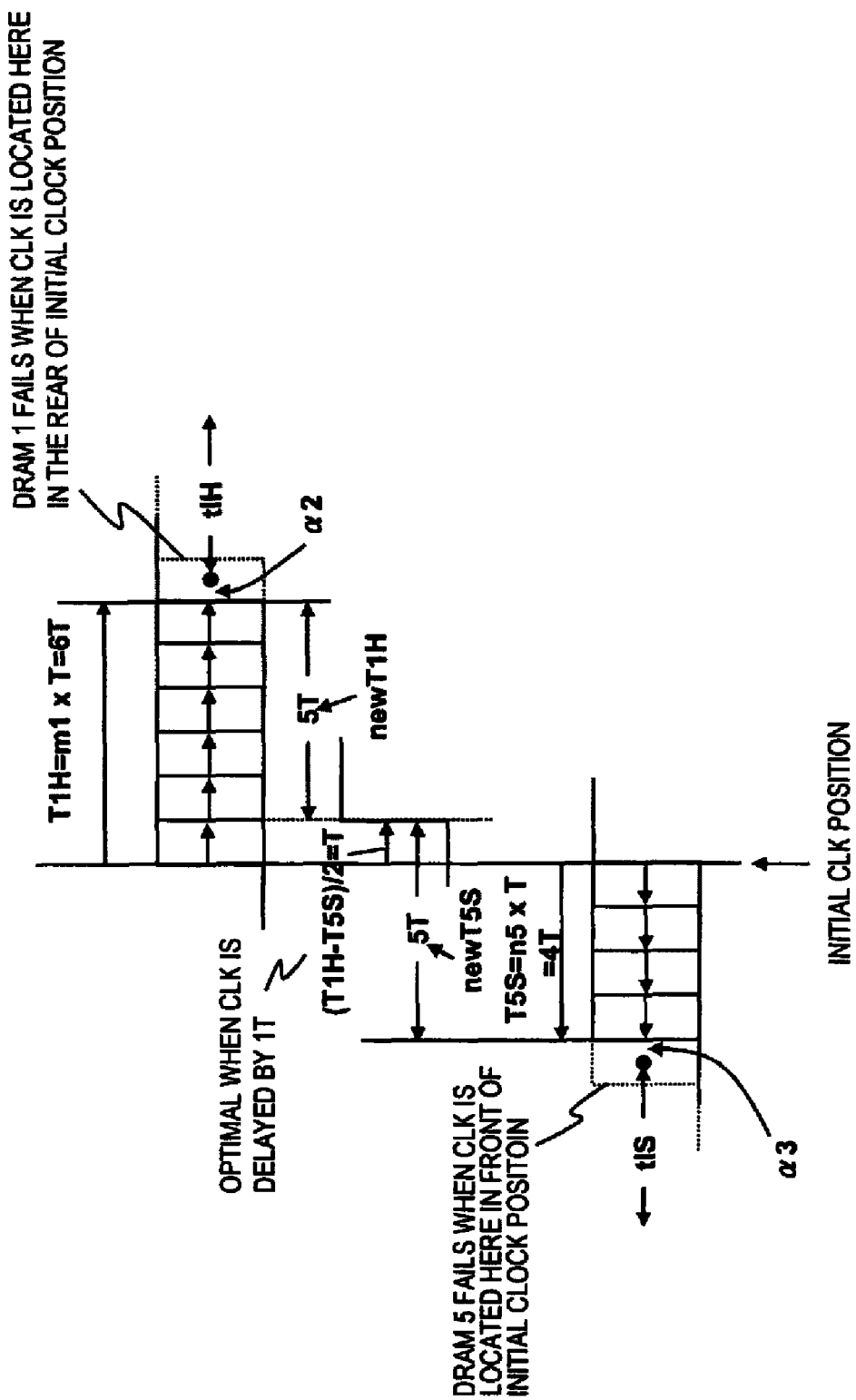
FIG. 21 is a (first) diagram explaining an optimal step time increment.

FIG. 21 is a diagram for explaining an optimal incremented Time step. FIG. 21 schematically shows a case where |m1−n5| is even (example where m1=6 and n5=4). For simplicity, a description will be given using movement of the clock CLK and the CA signal.

A time T1H=m1×T=6T located in the rear of an initial CLK position on the page of FIG. 21 indicates a time which, in case of pre-launching of the CA signal from the memory buffer 104 from their initial set value using the particular time step T, is one time step before the time at which the DRAM 1 nearest to the memory buffer 104 fails because of shortage of the hold (Hold) time. When the clock CLK is located at a position (indicated by α2) in the rear of the location of T1H=m1×T=6T at the DRAM 1, the DRAM 1 Fails.

A time T5S=n5×T=4T in front of the initial CLK position indicates a time which in case of post-launching of the CA signal from the memory buffer 104 from the initial set value using the particular time step T, is one time step before the time at which the DRAM 5 farthest to the memory buffer 104 fails because of shortage of the setup time. When the clock CLK is located at a position (indicated by α3) in front of the position of T5S=n5×T=4T at the DRAM 5, the DRAM 5 Fails.

The CA signal is advanced from the initial set value just by (T1H−T5S)/2=(m1−n5)T/2=(6−4)T/2=1T and are then output. When the description is given using the movement of the clock CLK, the clock CLK is delayed by 1T.

new $T1H=(n5+m1)T/2=5T$ new $T5S=(n5+m1)T/2=5T$

Accordingly, the relationship of |newT1S−new T5H|≦time step T is satisfied.

$5T$<Hold margin at DRAM 1<$6T$ $5T$<Setup margin at DRAM 5<$6T$

Accordingly, depending on the case, just 0.5T may be apportioned to one of the Hold margin and the Setup margin in an analog fashion.

In the case of a DDR3-1600, one clock cycle tCK=1250 ps. Thus, in the case of T=tCK/32, 0.5 T is equal to 19.5 ps. Since each of the Setup window and the Hold window is 625 ps wide, 19.5 ps is approximately 3% of each of the Setup window and the Hold window. Thus, an increment of tCK/32 seems to suffice in this case. When an optimal point is manually obtained, the same apportion amount is used.

Figure 22:
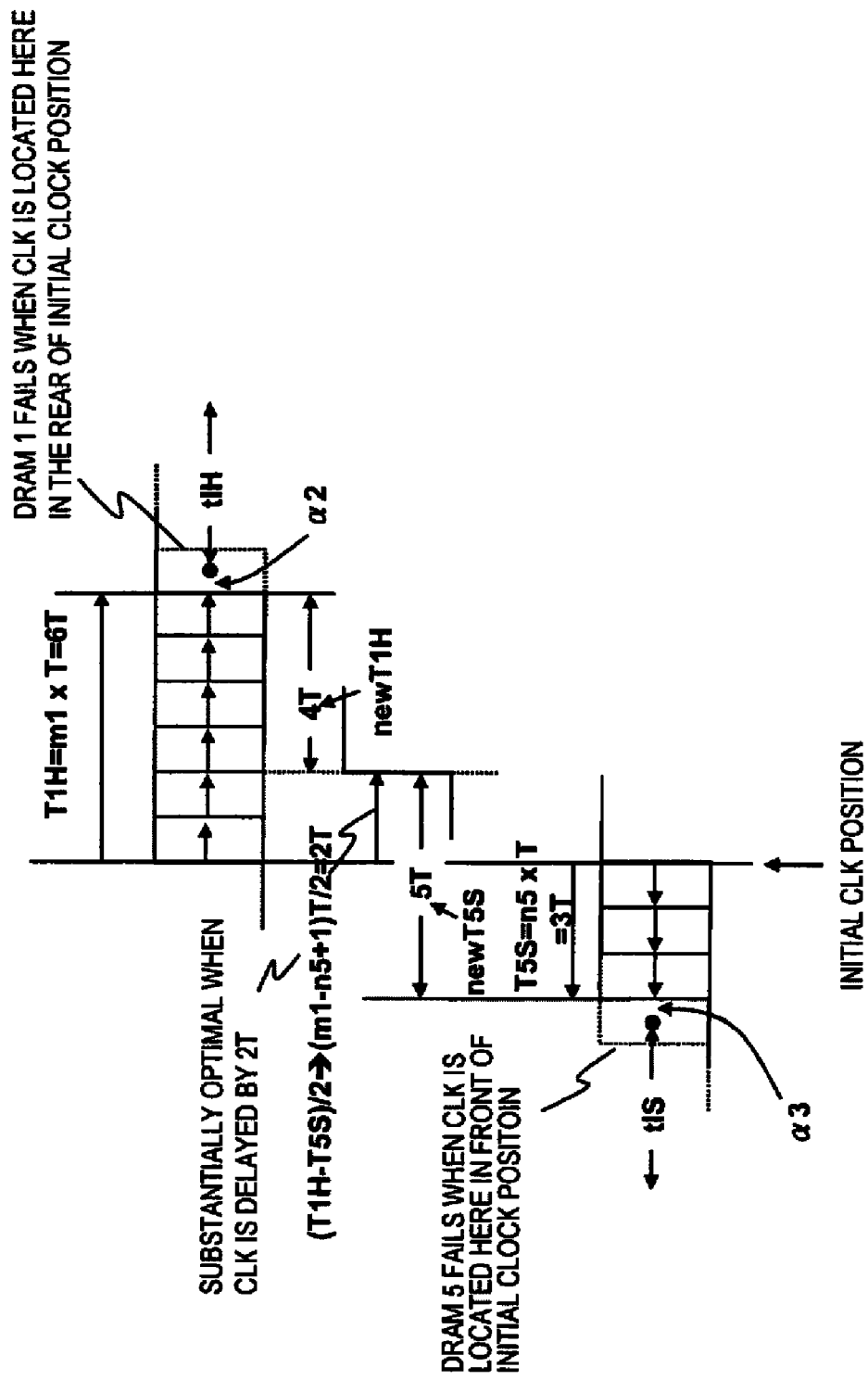
FIG. 22 is a (second) diagram explaining an optimal step time increment.

FIG. 22 is a diagram for explaining an optimal incremented Time step. FIG. 22 schematically shows a case where |m1−n5| is odd (example where m1=6 and n5=3). For simplicity, a description will be given using movement of the clock CLK and the CA signal.

The time T1H=m1×T=6T located in the rear of the initial CLK position on the page of FIG. 22 indicates a time which in case the memory buffer 104 pre-launches the CA signal from their initial set value using the particular time step T, is one time step before the time at which the DRAM 1 nearest to the memory buffer 104 fails because of shortage of the hold (Hold) time.

A time T5S=n5×T=3T located in front of the initial CLK position indicates a time which in case the memory buffer 104 post-launches the CA signal from their initial set value using the particular time step T, is one time step before the time at which the DRAM 5 farthest to the memory buffer 104 fails once because of shortage of the setup time.

Since |m1−n5| is odd, the CA signal is advanced from the initial set value just by (m1−n5+1)/2=2T, and is then output. When the description is given using the movement of the clock CLK, the clock CLK is delayed by 2T. Then, using the CA signal that has been set, a new time T1H and a new time T5S are obtained.

new $T1H=(n5+m1−1)T/2=4T$ new $T5S=(n5+m1+1)T/2=5T$

Accordingly, the relationship of |newT1S−new T5H|≦time step T is satisfied.

$4T$<Hold margin at DRAM 1<$5T$ $5T$<Setup margin at DRAM 5<$6T$

Accordingly, depending on the case, just 1T may be apportioned to one of the Hold margin and the Setup margin in the analog fashion.

In the case of the DDR3-1600, one clock cycle tCK=1250 ps. Thus, in the case of T=tCK/32, 1T is equal to 39.1 ps. Since each of the Setup window and the Hold window is 625 ps wide, 39.1 ps is approximately 6% of each of the Setup window and the Hold window. An increment of tCK/64 seems to suffice in this case. When an optimal point is manually obtained, the amount of 0.5T may be apportioned. Thus, no problem arises when the increment of tCK/32 is set. As described above, when training is adopted, the time step of tCK/64 or less is desirable. When the optimal point is manually obtained, the time step of tCK/32 or less may be set.

According to each example described above, the following effects are typically achieved.

Timing margins of the CA and CTRL signal is increased. Thus, an LR-DIMM capable of operating at high speed can be obtained.

An optimal timing on an actual DIMM can be obtained by the training function for obtaining the optimal timing.

Tests of the DRAMs using the training function for obtaining the optimal timing (such as determination about Failure due to shortage of the setup time or the hold time at each the DRAMs 1 and 5) may be controlled not only by a main buffer but also the memory controller which is a higher-level device, a CPU which controls the memory controller, or the like.

Figure 23:
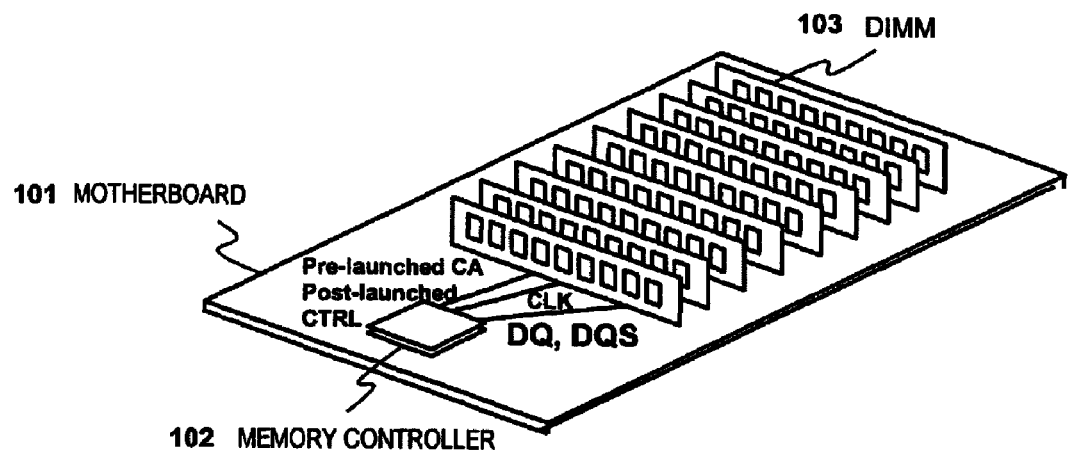
FIG. 23 is a (second) diagram explaining another example of the present invention.

Descriptions about the above-mentioned examples were directed to examples where the pre-launch function for the CA signal and the post-launch function for the set of the CTRL signal is implemented in the memory buffer 104 mounted on the LR-DIMM. The present invention is not of course limited to such a configuration. As shown in FIG. 23, for example, the pre-launch function for the CA signal and the post-launch function for the CTRL signal may be of course implemented in the memory controller 102. In this case, the DIMM may be a buffered (Registered) DIMM or an Unbuffered DIMM having no buffer.

Each disclosure of Patent Document listed above is incorporated herein by reference. Modifications and adjustments of the exemplary embodiment and the examples are possible within the scope of the overall disclosure (including claims) of the present invention, and based on the basic technical concept of the invention. Various combinations and selections of various disclosed elements are possible within the scope of the claims of the present invention. That is, the present invention of course includes various variations and modifications that could be made by those skilled in the art according to the overall disclosure including the claims and the technical concept.

What is claimed is:

1. A controller comprising:
a pre-launch circuit that advances an output timing of an address/command signal with respect to a clock signal; and
a post-launch circuit that delays an output timing of a control signal with respect to the clock signal,
the address/command signal with the output timing thereof adjusted by the pre-launch circuit and the control signal with the output timing thereof adjusted by the post-launch circuit being transmitted to a plurality of memory chips.

2. The controller according to claim 1, further comprising a unit that obtains, by training, an optimal output timing of the address/command signal with respect to the clock signal and/or an optimal output timing of the control signal with respect to the clock signal.

3. A memory buffer comprising
the controller as set forth in claim 1,
the memory buffer mounted on a module board to transmit and receive signals to and from a plurality of memory chips mounted on the module board.

4. A memory controller comprising
the controller as set forth in claim 1,
the memory controller transmitting and receiving signals to and from a plurality of memory chips.

5. A memory module comprising:
a module board;
a plurality of memory chips mounted on the module board; and
a memory buffer mounted on the module board, the memory buffer as set forth in claim 3.

6. A memory module comprising:
a module board;
a plurality of memory chips mounted on the module board; and
a memory buffer mounted on the module board, the memory buffer transmitting and receiving signals to and from a host device and to and from the plurality of memory chips, the memory buffer comprising:
a pre-launch circuit that advances an output timing of an address/command signal with respect to a clock signal; and
a post-launch circuit that delays an output timing of a control signal with respect to the clock signal,
the memory buffer transmitting the address/command signal with the output timing thereof adjusted by the pre-launch circuit and the control signal with the output timing thereof adjusted by the post-launch circuit to the plurality of memory chips.

7. The memory module according to claim 6, wherein a time step for timing adjustment by at least one of the pre-launch and post-launch circuit in the memory buffer is set to a predetermined value finer than ⅙ of one clock cycle.

8. The memory module according to claim 6, wherein the memory buffer obtains, by training, an optimal output timing of the address/command signal with respect to the clock signal and/or an optimal output timing of the control signal with respect to the clock signal.

9. The memory module according to claim 6, wherein a time step for the timing adjustment by at least one of the pre-launch and post-launch circuit in the memory buffer is set to be equal to or finer than 1/32 of one clock cycle.

10. The memory module according to claim 6, wherein the memory buffer comprises:
a first sampling circuit that receive the address/command signal;
a second sampling circuit that receive the control signal;
a PLL (Phase-Locked Loop) circuit that receives the clock signal;
a storage unit that stores a phase advance amount and a phase delay amount; and
a first control circuit that receives the phase advance amount and the phase delay amount from the storage unit and supplies a control signal specifying the phase advance amount and the phase delay amount to the PLL circuit;
the PLL circuit producing first and second clock signals having phases advanced and delayed with respect to the clock signal in correspondence with the phase advance amount and the phase delay amount, respectively, and a third clock signal having a phase synchronized with the clock signal,
the first and second clock signals supplied as sampling clocks to the first and second sampling circuits, respectively,
the third signal supplied in common to the plurality of memory chips,
outputs of the first and second sampling circuits respectively supplied as the address/command signal and the control signal to the plurality of memory chips.

11. The memory module according to claim 10, wherein the memory buffer comprises:
a second control circuit that obtains, by training, an optimal output timing of the address/command signal with respect to the clock signal and/or an optimal output timing of the control signal with respect to the clock signal to store the phase advance amount and/or the phase delay amount corresponding to the optimal timing in the storage unit.

12. The memory module according to claim 6, wherein in performing the timing adjustment of the address/command signal with respect to the clock signal, the memory buffer outputs the address/command signal to the plurality of the memory chip by successively advancing a phase thereof from an initial set value one by one using a time step T to obtain a first time T1H which is m1 times of the time step T, and which is one time step before the time at which a first memory chip arranged nearest among the plurality of the memory chips to the memory buffer on the memory module fails due to shortage of a hold time to store the time T1H in a storage unit of the memory buffer, and
the memory buffer outputs the address/command signal by successively delaying a phase thereof from the initial set value one by one using the time step T to obtain a second time T5S which is n5 times of the time step T, and which is one time step before the time at which a second memory chip arranged farthest among the plurality of the memory chip from the memory buffer fails due to shortage of a setup time to store the time T5S in the storage unit, the memory buffer outputting the address/command signal having a phase advanced from the initial set value just by a time corresponding to (T1H−T5S)/2 which is equal to (m1−n5)T/2, and the memory buffer obtaining the first and second times T1H and T5S, newly, using the address/command signal having the above set phase, the memory buffer finishing timing adjustment training for the address/command signal with respect to the clock signal, when an absolute value of a difference between the newly obtained first and second times T1H and T5S is equal to or less than the time step.

13. The memory module according to claim 12, wherein when the address/command signal is advanced from the initial value by a time corresponding to a time (T1H−T5S)/2 for output and the time (T1H−T5S)/2 is negative, the memory buffer delays the address/command signal by an absolute value of the time (T1H−T5S)/2, and when the absolute value of the time (m1−n5) is odd, the memory buffer delays the address/command signal by an absolute value of the time (m1−n5+1)T/2.

14. The memory module according to claim 6, wherein in performing the timing adjustment of the control signal with respect to the clock signal, the memory buffer outputs the control signal to the plurality of the memory chips by successively delaying a phase thereof from an initial set value one by one using the predetermined time step T to obtain a first time T1S which is n1 times of the time step T, and which is one time step before the time at which a first memory chip arranged nearest among the plurality of the memory chips to the memory buffer on the memory module fails due to shortage of a setup time to store the time T1S in a storage unit of the memory buffer, and the memory buffer outputs the control signal to the plurality of the memory chips by successively advancing a phase from the initial set value one by one using the time step T to obtain a second time T5H which is m5 times of the time step T, and is one time step before the time at which a second memory chip arranged farthest among the plurality of the memory chips from the memory buffer on the memory module fails due to shortage of a hold time to store the time T5H in the storage unit, the memory buffer delays a phase of the control signal from the initial set value just by a time corresponding to (T1S−T5H)/2 equal to (n1−m5)T/2 to deliver the delayed the control signal; and the memory buffer obtains the first and second times T1S and T5H, newly, using the command signals with the phase delayed, and finishes timing adjustment training for the control signal with respect to the clock signal when an absolute value of a difference between the newly obtained times T1S and T5H is equal to or less than the time step T.

15. The memory module according to claim 14, wherein when the control signal is delayed from the initial set value by a time corresponding to (T1S−T5H)/2 and the time (T1S−T5H)/2 is negative, the memory buffer advances a phase of the control signal by an absolute value of the time (T1S−T5H)/2, and when the absolute value of the time (n1−m5) is odd, the memory buffer advances the address/command signal by an absolute value of the time (n1−m5+1)T/2.

* * * * *